United States Patent
Kamikubo

(10) Patent No.: US 7,495,243 B2
(45) Date of Patent: Feb. 24, 2009

(54) WRITING METHOD OF CHARGED PARTICLE BEAM, SUPPORT APPARATUS OF CHARGED PARTICLE BEAM WRITING APPARATUS, WRITING DATA GENERATING METHOD AND PROGRAM-RECORDED READABLE RECORDING MEDIUM

(75) Inventor: Takashi Kamikubo, Kanagawa (JP)

(73) Assignee: NuFlare Technology, Inc., Numazu-shi (JP)

( * ) Notice: Subject to any disclaimer, the term of this patent is extended or adjusted under 35 U.S.C. 154(b) by 184 days.

(21) Appl. No.: 11/682,494

(22) Filed: Mar. 6, 2007

(65) Prior Publication Data
US 2008/0073574 A1    Mar. 27, 2008

(30) Foreign Application Priority Data
Mar. 8, 2006    (JP) .............................. 2006-062047

(51) Int. Cl.
G03F 7/20    (2006.01)
H01J 3/14    (2006.01)
H01J 37/302    (2006.01)

(52) U.S. Cl. .............................. 250/492.22; 250/492.2; 250/492.1; 250/492.3; 250/306; 250/307

(58) Field of Classification Search ............ 250/492.22, 250/492.2, 492.1, 492.3, 306, 307
See application file for complete search history.

(56) References Cited

U.S. PATENT DOCUMENTS 6,831,283 B2 * 12/2004 Yoda et al. ............. 250/492.22
7,109,483 B2 * 9/2006 Nakasuji et al. ............. 250/310
2003/0146397 A1 * 8/2003 Yoda et al. ............. 250/492.22
2008/0182185 A1 * 7/2008 Abe et al. ...................... 430/30
2008/0265174 A1 * 10/2008 Hiramoto et al. ............ 250/398

FOREIGN PATENT DOCUMENTS

| JP | 11-204415 | 7/1999 |
|----|-----------|--------|
| JP | 2000-75467 | 3/2000 |
| JP | 2003-318077 | 11/2003 |
| JP | 2005-195787 | 7/2005 |
| KR | 1998-070537 | 10/1998 |

\* cited by examiner

*Primary Examiner*—Nikita Wells
(74) *Attorney, Agent, or Firm*—Oblon, Spivak, McClelland, Maier & Neustadt, P.C.

(57) ABSTRACT

A charged particle beam writing method includes inputting design pattern data, virtually dividing a writing area to be written with the design pattern data into a plurality of small areas in a mesh-like manner, calculating a pattern density in each of the plurality of small areas based on the design pattern data, calculating a resizing amount for each pattern density in a case of irradiating a charged particle beam at an isofocal dose, resizing a dimension of the design pattern data in each of the plurality of small areas, based on the resizing amount in each of the plurality of small areas, and writing a resized design pattern on a target workpiece with the isofocal dose corresponding to the pattern density which was calculated before the resizing in each of the plurality of small areas.

10 Claims, 21 Drawing Sheets

42 : Original Design Pattern

44 : Pattern After Resizing

WRITING METHOD OF CHARGED PARTICLE BEAM, SUPPORT APPARATUS OF CHARGED PARTICLE BEAM WRITING APPARATUS, WRITING DATA GENERATING METHOD AND PROGRAM-RECORDED READABLE RECORDING MEDIUM

CROSS-RELATION TO RELATED APPLICATION

This application is based upon and claims the benefit of priority from the prior Japanese Patent Application No. 2006-062047 filed on Mar. 8, 2006 in Japan, the entire contents of which are incorporated herein by reference.

BACKGROUND OF THE INVENTION

1. Field of the Invention

The present invention relates to a writing or "drawing" method of a charged particle beam, a generating or "creating" method of writing data, and a computer-readable recording medium with a program recorded thereon. For example, it is related with an electron beam writing method of irradiating electron beams onto a target workpiece while variably-shaping the electron beams, or a generating method of writing data to be input into an electron beam pattern writing apparatus. Alternatively, it is related with a program for embodying these methods.

2. Description of Related Art

Microlithography technology which forwards miniaturization of semiconductor devices is extremely important, because only this process performs forming a pattern in semiconductor manufacturing processes. In recent years, circuit line widths used when writing a desired pattern on semiconductor devices are becoming minute year after year with an increase in high-integration of LSI. In order to form a desired circuit pattern on these semiconductor devices, a high-precision original pattern, such as a reticle or a photomask, is needed. The electron beam writing technology for writing a pattern herein essentially has excellent resolution, and therefore is used for manufacturing such high-precision original patterns.

FIG. 30 shows a schematic diagram for explaining operations of a conventional variable-shaped electron beam pattern writing apparatus. As shown in the figure, the variable-shaped electron beam pattern writing apparatus (EB (Electron beam) writing apparatus) includes two aperture plates and operates as follows. A first aperture 410 has an opening or "hole" 411 in the shape of rectangle, for example, for shaping an electron beam 330. This shape of the rectangular opening may also be a square, a rhombus, a rhomboid, etc. A second aperture 420 has a specially shaped opening 421 for shaping the electron beam 330 having passed through the opening 411 of the first aperture 410 into a desired rectangular. The electron beam 330 that left a charge particle source 430 and has passed through the opening 411 is deflected by a deflector. Then, the electron beam 330 passes through part of the specially shaped opening 421 of the second aperture 420, and reaches a target workpiece 340 mounted on a stage which is continuously moving in one predetermined direction (e.g. X-axis direction) during the writing. In other words, a rectangular shape capable of passing through both the opening 411 and the specially shaped opening 421 is used for pattern writing of the target workpiece 340 mounted on the stage. This method of writing or "forming" a given variable shape by letting beams pass through both the opening 411 and the specially shaped opening 421 is called the "variable shaping."

In the electron beam writing mentioned above, highly precise critical dimension uniformity is required when writing a pattern on a target workpiece, such as a mask. However, in the electron beam writing, a phenomenon called a proximity effect will occur. In the case of irradiating electron beams onto a mask, where resist is applied, in order to write a circuit pattern thereon, the phenomenon of the proximity effect is generated by backward scattering, meaning that an electron beam penetrates resist film, reaches a layer under the resist film to be reflected, and enters the resist film again. As a result, a pattern is written in dimension deviated from desired one. That is, fluctuation in dimension occurs. On the other hand, when developing the resist film or etching the layer under it after writing a pattern, a dimension fluctuation called a loading effect resulting from the density of a circuit pattern occurs.

As a technique for correcting the proximity effect or the loading effect, the whole circuit pattern is virtually divided into a plurality of small regions, for example, 500 square µm for the global loading effect, 0.5 square µm for the proximity effect, or 50 square nm for the micro loading effect, and a map showing degree of influence is created. It is disclosed, for example, in Published Unexamined Japanese Patent Application No. 2005-195787 (JP-A-2005-195787), that a circuit pattern of a predetermined area density of 50% can be appropriately written and a dose for writing can be calculated using a dose (a fixed value), a map of proximity effect influence values, and a map of proximity effect correction coefficient η calculated from the loading effect correction amount. Moreover, a technique of correcting the loading effect not by correcting a dose but by resizing a pattern dimension in the mask design data beforehand is disclosed, for example, JP-A-2000-75467.

As mentioned above, in the electron beam writing, it has been developed to correct the proximity effect by fluctuating a dose. If it is possible to write a pattern using an isofocal dose, a pattern dimension fluctuation can be prevented even when a height deviation of a target workpiece surface or a focal positional deviation error caused by a lens excitation error etc. occurs at the focal position. However, the optimal dose irradiated in correcting the proximity effect according to the dose change method stated above is not necessarily in accordance with the isofocal dose. Therefore, even when a pattern is written with the optimal dose calculated by proximity effect correction to be in accordance with the dimension of the pattern, if an error arises at the focal position, deviation is generated in each pattern dimension. In other words, in the method of correcting the proximity effect by way of fluctuating the dose, a tolerance to a pattern dimension error caused by a focal positional deviation error is small.

BRIEF SUMMARY OF THE INVENTION

It is an object of the present invention to provide a writing method for preventing a pattern dimension fluctuation at the time of a focal positional deviation error being generated, and to provide a method and an apparatus for calculating writing data to be used in the aimed writing method.

In accordance with one aspect of the present invention, a charged particle beam writing method includes inputting design pattern data, virtually dividing a writing area to be written with the design pattern data into a plurality of small areas in a mesh-like manner, calculating a pattern density in each of the plurality of small areas based on the design pattern data, calculating a resizing amount for each pattern density in a case of irradiating a charged particle beam at an isofocal dose, resizing a dimension of the design pattern data in each of the plurality of small areas, based on the resizing amount in each of the plurality of small areas, and writing a resized design pattern on a target workpiece with the isofocal dose corresponding to the pattern density which was calculated before the resizing in each of the plurality of small areas.

In accordance with another aspect of the present invention, a support apparatus of a charged particle beam pattern writing apparatus includes a pattern density calculation part configured to input design pattern data, virtually divide a writing area to be written with the design pattern data into a plurality of small areas in a mesh-like manner and calculate a pattern density in each of the plurality of small areas based on the design pattern data, a storage device configured to store a first correlation data on a correlation between the pattern density and an isofocal dose of a charged particle beam and a second correlation data on a correlation between the pattern density and a resizing amount, an isofocal dose calculation part configured to read the first correlation data from the storage device and calculate the isofocal dose of the charged particle beam in each of the plurality of small areas using the first correlation data, a resizing processing part configured to read the second correlation data from the storage device and resize a dimension of the design pattern data in each of the plurality of small areas using the second correlation data, and an output part configured to output the isofocal dose of the charged particle beam and resized design pattern data in each of the plurality of small areas to a pattern writing apparatus which writes a pattern on a target workpiece using the charged particle beam.

In accordance with another aspect of the present invention, a writing data generating method includes inputting design pattern data, virtually dividing a writing area to be written with the design pattern data into a plurality of small areas in a mesh-like manner, calculating a pattern density in each of the plurality of small areas based on the design pattern data, calculating an isofocal dose in each of the plurality of small areas using correlation data on a correlation between the pattern density and the isofocal dose, resizing a dimension of the design pattern data in each of the plurality of small areas using correlation data on a correlation between the pattern density and a resizing amount, and outputting the isofocal dose in each of the plurality of small areas and resized design pattern data in each of the plurality of small areas.

In accordance with another aspect of the present invention, a computer-readable recording medium with a program recorded for causing a computer to execute processes includes storing design pattern data in a storage device, reading the design pattern data from the storage device, virtually dividing a writing area to be written with the design pattern data into a plurality of small areas in a mesh-like manner, calculating a pattern density in each of the plurality of small areas based on the design pattern data, reading first correlation data on a correlation between the pattern density and an isofocal dose from a storage device which stores the first correlation data, calculating the isofocal dose of each of the plurality of small areas using the first correlation data, reading second correlation data on a correlation between the pattern density and a resizing amount from a storage device which stores the second correlation data, resizing a dimension of the design pattern data in each of the plurality of small areas using the second correlation data, and outputting the isofocal dose of each of the plurality of small areas and resized design pattern data in each of the plurality of small areas.

DETAILED DESCRIPTION OF THE INVENTION

In the following embodiments, structures utilizing an electron beam as an example of a charged particle beam will be described. The charged particle beam is not restricted to the electron beam, and may be the one using a charged particle, such as an ion beam.

Embodiment 1

Figure 1:
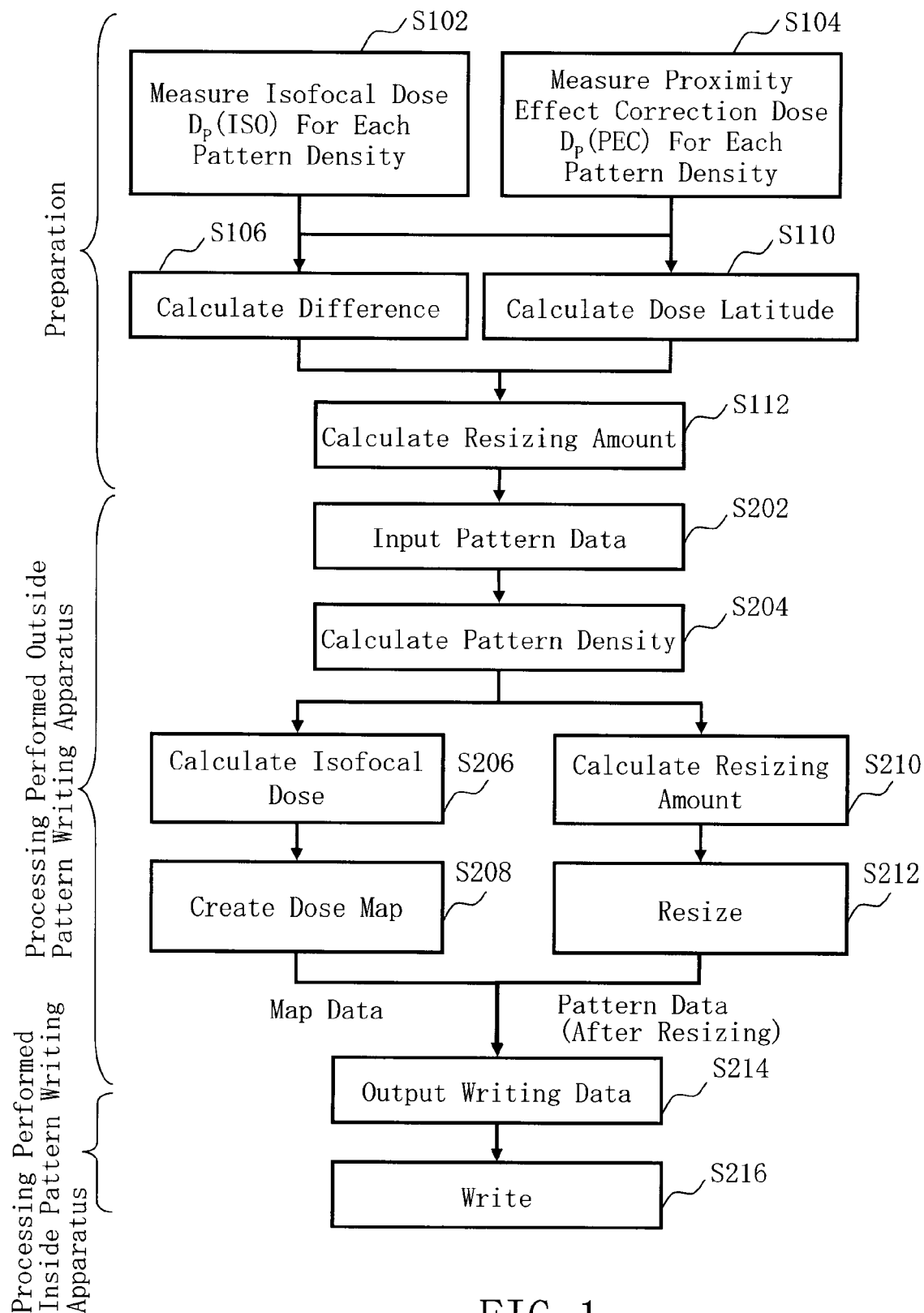
FIG. 1 is a flowchart showing examples of main steps of an electron beam pattern writing method described in Embodiment 1.

FIG. 1 is a flowchart showing examples of main steps of an electron beam pattern writing method described in Embodiment 1. In FIG. 1, according to the electron beam pattern writing method serving as an example of a charged particle beam pattern writing method, a series of the following steps is executed as preparatory steps: an isofocal dose Dp (ISO) measurement step (S102) for each pattern density, a proximity effect correction dose Dp (PEC) measurement step (S104) for each pattern density, a difference calculation step (S106), a dose latitude calculation step (S110), and a resizing amount calculation step (S112). By performing these steps, a correlation between a pattern density and an isofocal dose, and a correlation between a pattern density and a resizing amount can be acquired. Next, as processing performed outside the pattern writing apparatus serving as a writing data generating method, a series of the following steps is executed: a pattern data input step (S202), a pattern density calculation step (S204), an isofocal dose Dp (ISO) calculation step (S206), a dose map creation step (S208), a resizing amount calculation step (S210), a resizing step (S212), and a writing data output step (S214). Then, as processing performed inside the pattern writing apparatus, a writing step (S216) is executed.

Figure 2:
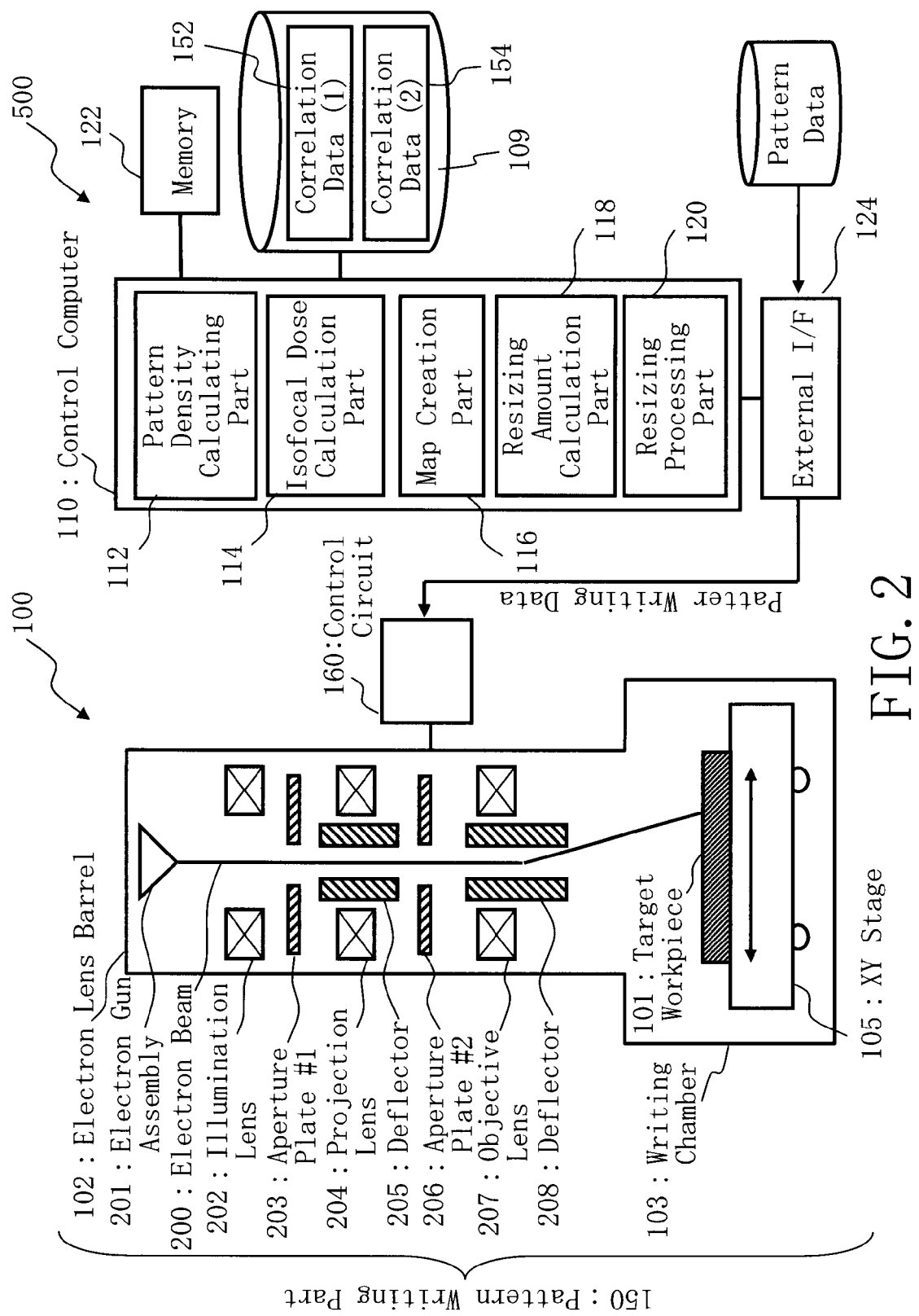
FIG. 2 is a schematic diagram showing the structures of a pattern writing apparatus and a support apparatus of the pattern writing apparatus described in Embodiment 1.

FIG. 2 is a schematic diagram showing the structures of a pattern writing apparatus and a support apparatus of the pattern writing apparatus described in Embodiment 1. In the figure, a pattern writing apparatus 100 serving as an example of a charged particle beam pattern writing apparatus includes a pattern writing part 150 and a control circuit 160. The control circuit 160 constitutes a control part, and the pattern writing part 150 includes an electron lens barrel 102 and a writing chamber 103.

In the electron lens barrel 102, an electron gun assembly 201, an illumination lens 202, a first aperture plate 203, a projection lens 204, a deflector 205, a second aperture plate 206, an objective lens 207, and a deflector 208 are arranged. In the writing chamber 103, an XY stage 105 is arranged and a target workpiece 101 to be written is laid or "placed" on the XY stage 105.

The support apparatus 500 includes a control computer 110, a memory 122, a magnetic disk drive 109, and an external interface (I/F) 124. The support apparatus 500 which serves as an example of a writing data generation apparatus supports the pattern writing apparatus 100. The control computer 110 has functions of a pattern density calculation part 112, an isofocal dose calculation part 114, a map creation part 116, a resizing amount calculation part 118, and a resizing processing part 120. In the magnetic disk drive 109, correlation data (1) 152 and correlation data (2) 154 are stored. The correlation data (1) 152 is information on correlation between a pattern density and an isofocal dose. The correlation data (2) 154 is information on correlation between a pattern density and a resizing amount.

The memory 122, the magnetic disk drive 109, and the external interface (I/F) 124 are connected to the control computer 110 through buses not shown. Data from the outside of the support apparatus 500 is input/output through the external I/F 124.

Structure elements required for describing Embodiment 1 are illustrated in FIG. 2. Other structure elements usually needed for the pattern writing apparatus 100 and the support apparatus 500 may also be included. In FIG. 2, processing of each function of the pattern density calculation part 112, the isofocal dose calculation part 114, the map creation part 116, the resizing amount calculation part 118, and the resizing processing part 120 is executed by the control computer 110 serving as an example of a computer. However, it should not exclusively be limited thereto. For example, they may be executed by hardware of an electric circuit. Alternatively, they may be executed by a combination of hardware of an electric circuit and software, or a combination of hardware and firmware. The control circuit 160 may control the pattern writing apparatus 100 by executing software by using a control computer serving as an example of computers. Alternatively, it may be executed by hardware of an electric circuit, combination of hardware and software, or combination of hardware and firmware.

An electron beam 200, being an example of a charged particle beam and leaving the electron gun assembly 201, is irradiated or "shot" by the illumination lens 202 onto the whole of a rectangular opening, for example, which is formed in the first aperture plate 203. At this point, the electron beam 200 is shaped to be a desired rectangle, for example. Then, after having passed through the first aperture plate 203, the electron beam 200 of a first aperture image is guided by the projection lens 204 to reach the second aperture plate 206. The position of the first aperture image on the second aperture plate 206 is controlled by the deflector 205, and thereby the shape and size of the beam can be changed. After having passed through the second aperture plate 206, the electron beam 200 of a second aperture image is focus-adjusted by the objective lens 207 and deflected by the deflector 208, to reach a desired position on the target workpiece 101 which is placed on the XY stage 105. Writing is performed while the XY stage 105 is continuously moving. Each structure element is controlled by the control circuit 160. Input/output data such as a result calculated by a control computer (not shown) in the control circuit 160 is stored in a storage device, such as a memory (not shown).

The electron beam writing method according to the present Embodiment will be explained hereafter. First, as a preparatory step, a correlation between a pattern density (pattern area density) and an isofocal dose and a correlation between a pattern density and a resizing amount are obtained.

Figure 3:
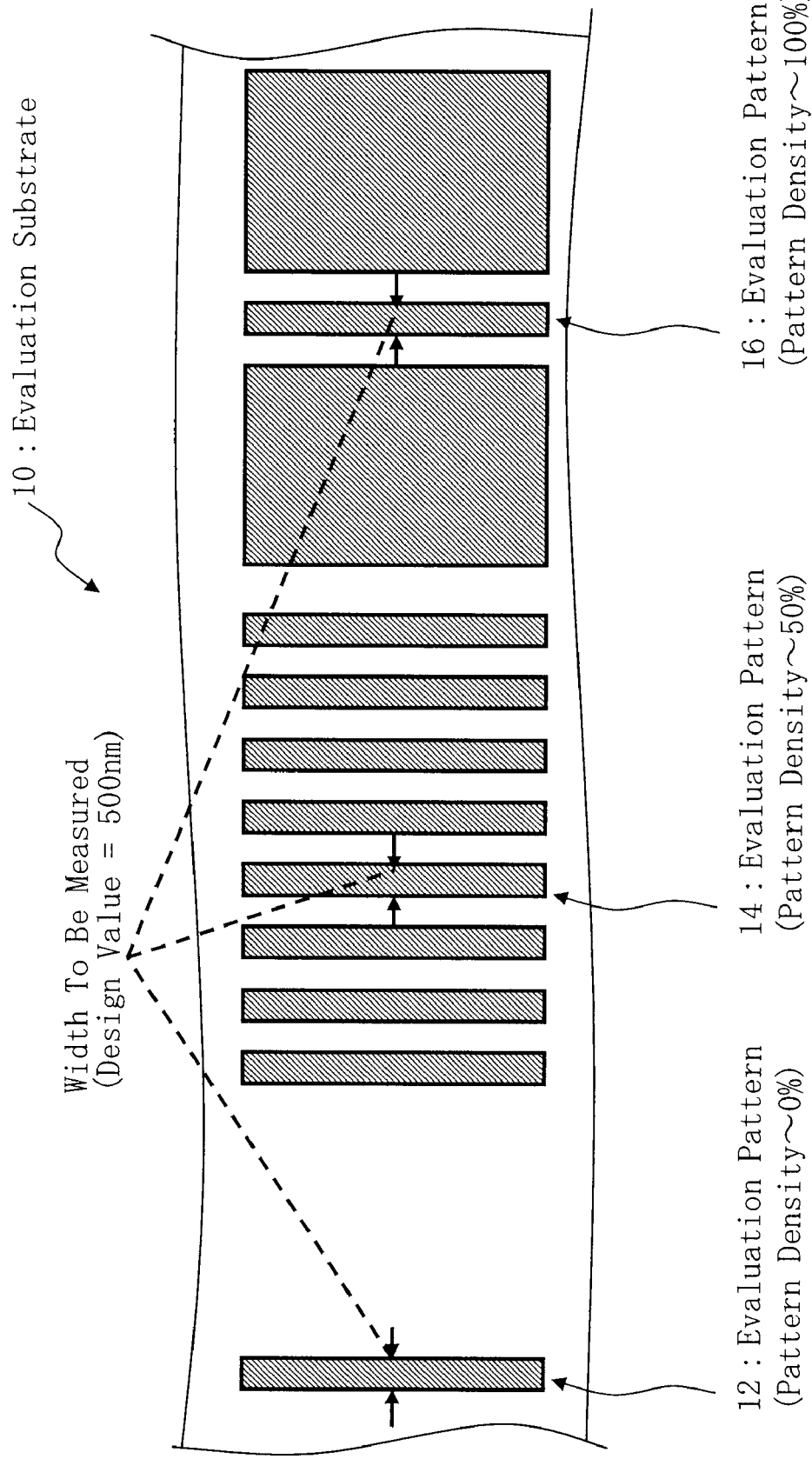
FIG. 3 shows an example of an evaluation pattern described in Embodiment 1.

In S(step) 102, as the isofocal dose Dp (ISO) measurement step (S102) for each pattern density, an isofocal dose Dp (ISO) is measured for each pattern density with respect to patterns of a plurality of pattern densities. FIG. 3 shows an example of an evaluation pattern described in Embodiment 1. In the figure, an evaluation substrate 10 on which three types of evaluation patterns are written is shown as an example. The first one is an evaluation pattern 12 whose pattern density can be regarded as about 0%. The second one is an evaluation pattern 14 whose pattern density is 50%. The third one is an evaluation pattern 16 whose pattern density can be regarded as about 100%. Resist film is applied on the evaluation substrate 10. Using this evaluation substrate 10, an optimal isofocal dose Dp (ISO) of each evaluation pattern is measured while changing a focal position and a dose by the pattern writing apparatus 100. In the measuring, as shown in FIG. 3, a pattern width dimension CD (critical dimension) of a resist pattern for which writing and processing procedures have been performed is measured.

In step S104, as the proximity effect correction dose Dp (PEC) measurement step for each pattern density, a proximity effect correction dose Dp (PEC) is measured for each pattern density with respect to patterns of a plurality of pattern densities. Similar to the case of measuring the isofocal dose Dp (ISO), the evaluation substrate 10 on which resist film has been applied is used. The optimal proximity effect correction dose Dp (PEC) of each evaluation pattern is measured while changing a focal position and a dose by the pattern writing apparatus 100. Similarly, a pattern width dimension CD of a resist pattern for which writing and processing procedures have been performed is measured as shown in FIG. 3.

Figure 4:
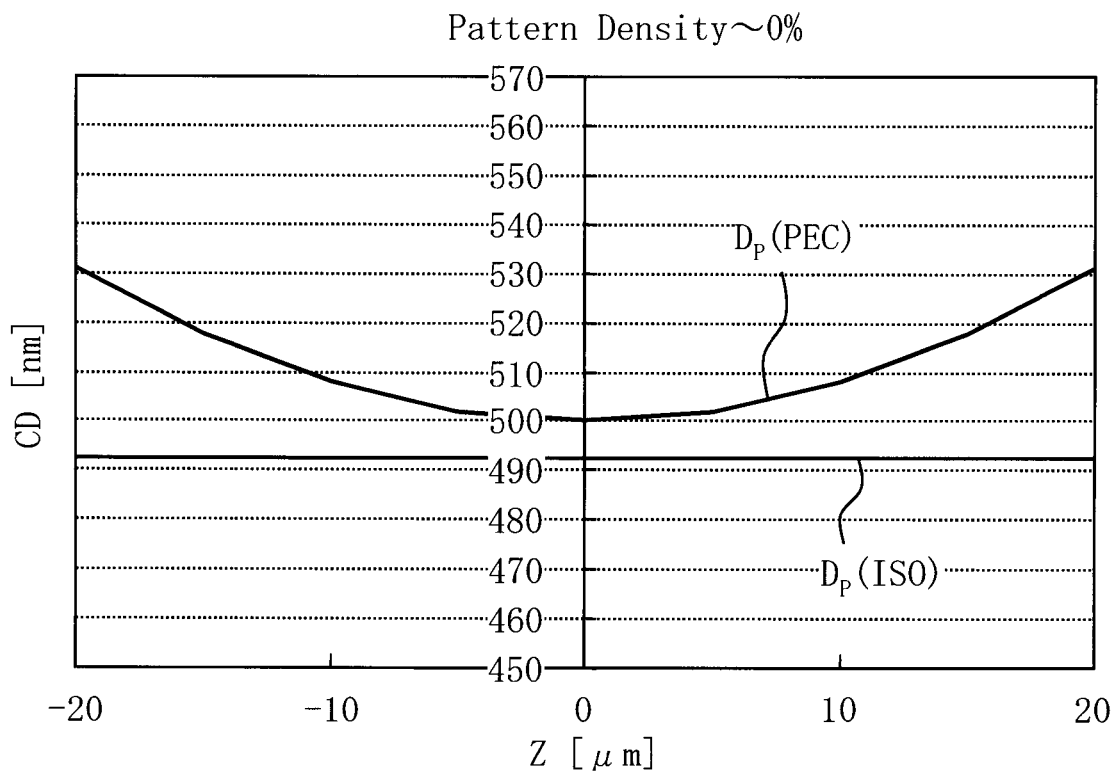
FIG. 4 shows a relation between a focal position and a pattern width dimension with respect to the isofocal dose and the proximity effect correction dose in the case of a pattern density of 0% described in Embodiment 1.
Figure 5:
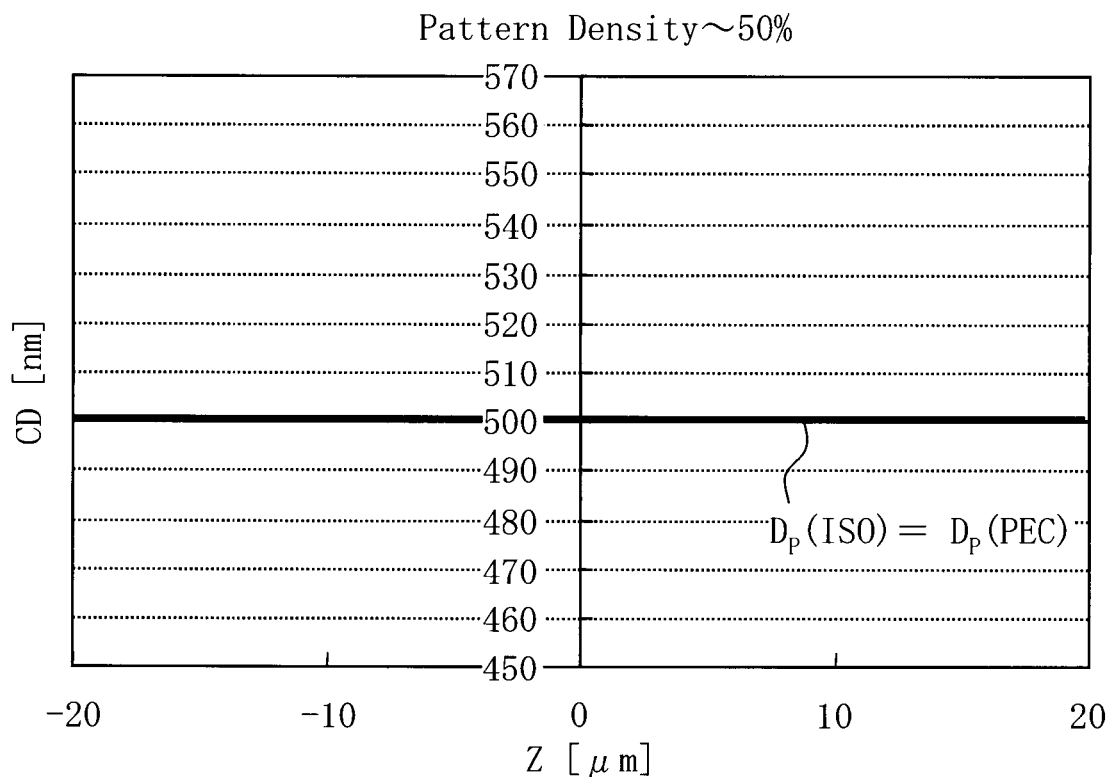
FIG. 5 shows a relation between a focal position and a pattern width dimension with respect to the isofocal dose and the proximity effect correction dose in the case of a pattern density of 50% described in Embodiment 1.
Figure 6:
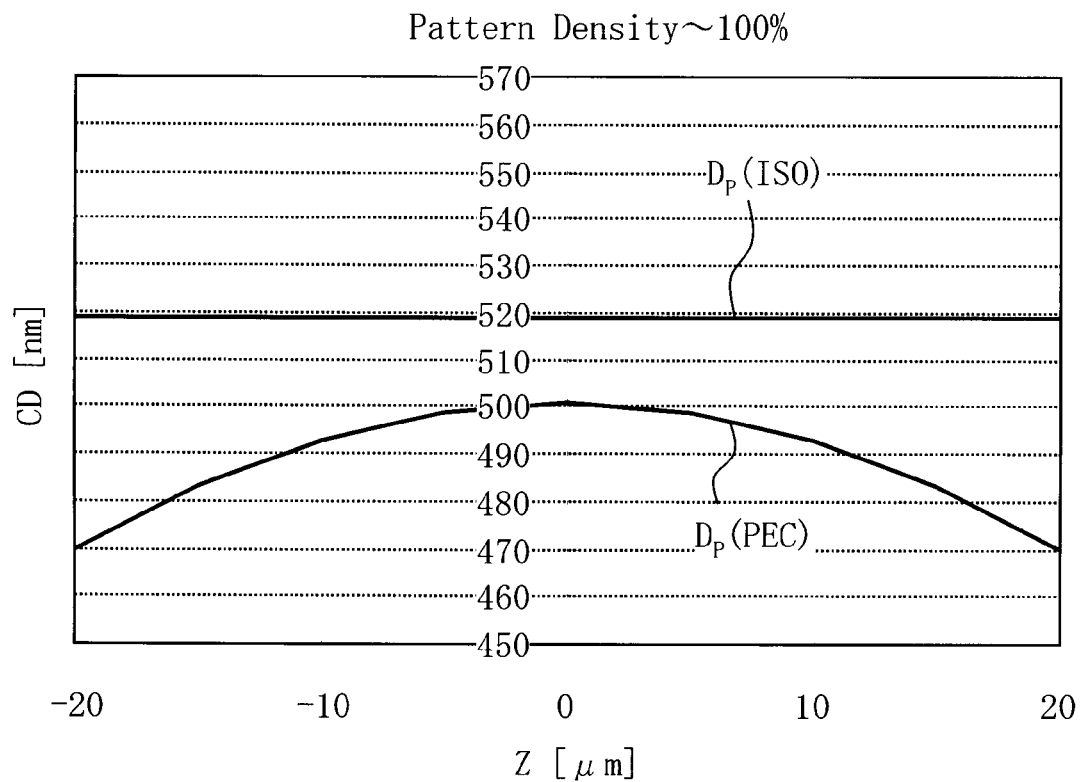
FIG. 6 shows a relation between a focal position and a pattern width dimension with respect to the isofocal dose and the proximity effect correction dose in the case of a pattern density of 100% described in Embodiment 1.

FIG. 4 shows a relation between a focal position and a pattern width dimension with respect to the isofocal dose and the proximity effect correction dose in the case of a pattern density of 0% described in Embodiment 1. FIG. 5 shows a relation between a focal position and a pattern width dimension with respect to the isofocal dose and the proximity effect correction dose in the case of a pattern density of 50% described in Embodiment 1. FIG. 6 shows a relation between a focal position and a pattern width dimension with respect to the isofocal dose and the proximity effect correction dose in the case of a pattern density of 100% described in Embodiment 1.

In FIGS. 4, 5, and 6, the abscissa axis indicates a focal position (defocusing amount) and the ordinate axis indicates a pattern width dimension. As understood from FIGS. 4, 5 and 6, like the dose Dp (ISO) not depending upon a focal position, it is possible to set the proximity effect correction dose to be independent of a focal position in a certain pattern density, which corresponds to the case of the pattern density of 50% in FIG. 5, for example. It is impossible to set the proximity effect correction dose to be independent of a focal position in all pattern densities. As shown in the cases of the pattern densities of 0% and 100% in FIGS. 4 and 6, the proximity effect correction dose largely deviates from the isofocal dose, depending upon a focal position. Moreover, deviation between the isofocal dose Dp (ISO) and the proximity effect correction dose Dp (PEC) changes depending upon the pattern density.

Figure 7:
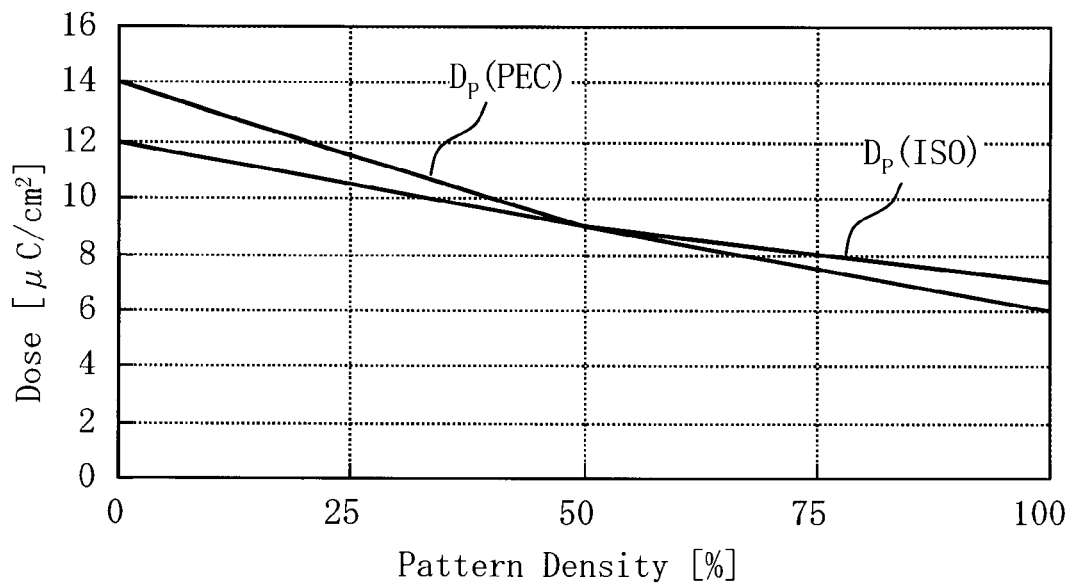
FIG. 7 shows a relation between a pattern density and a dose with respect to the isofocal dose and the proximity effect correction dose described in Embodiment 1.

FIG. 7 shows a relation between a pattern density and a dose with respect to the isofocal dose and the proximity effect correction dose described in Embodiment 1. In the figure, the isofocal dose Dp (ISO) and the proximity effect correction dose Dp (PEC) at the best focus position in each pattern density are shown. As mentioned above, depending upon the pattern density, deviation between the isofocal dose Dp (ISO) and the proximity effect correction dose Dp (PEC) changes. The data of the isofocal dose in FIG. 7 is the correlation data (1) 152 indicating a correlation between a pattern density and an isofocal dose.

Figure 8:
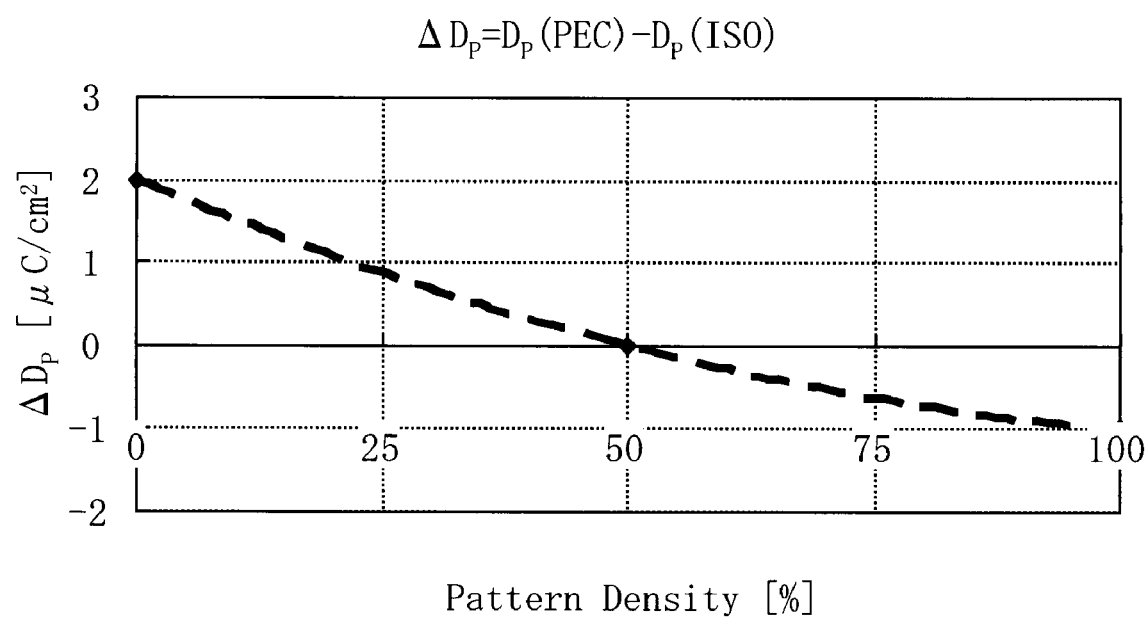
FIG. 8 shows a correlation between a difference and a pattern density described in Embodiment 1.

In step S106, as the difference calculation step, a difference $\Delta Dp$ between the isofocal dose Dp (ISO) and the proximity effect correction dose Dp (PEC) in each pattern density is calculated. The proximity effect correction dose means a dose in which proximity effect has been corrected. FIG. 8 shows a correlation between a difference and a pattern density according to Embodiment 1. In the figure, the abscissa axis indicates a pattern density and the ordinate axis indicates a difference $\Delta Dp$.

Figure 9:
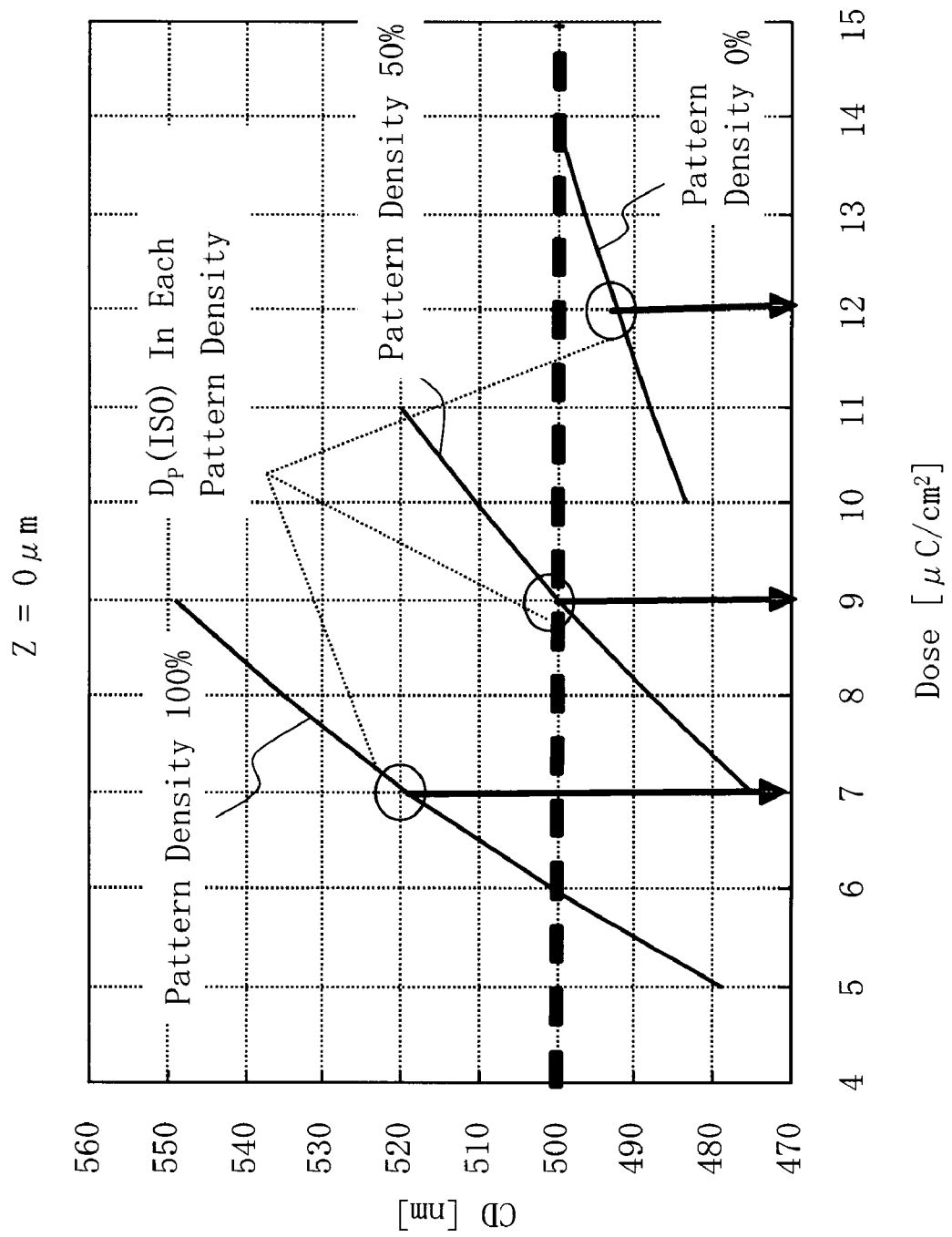
FIG. 9 shows a relation between a dose and a pattern dimension at the best focus position described in Embodiment 1.

In step S110, as the dose latitude calculation step, a pattern dimension fluctuation amount (dose latitude (DL)) at a change of unit dose of the isofocal dose Dp (ISO) in each pattern density is calculated. FIG. 9 shows a relation between a dose and a pattern dimension at the best focus position described in Embodiment 1. In the figure, the abscissa axis indicates a dose and the ordinate axis indicates a pattern dimension CD. When writing the evaluation pattern of FIG. 3 and measuring the pattern dimension CD, an isofocal dose Dp (ISO) and a proximity effect correction dose Dp (PEC) are measured while changing a dose. Therefore, a pattern dimension CD with respect to the dose change at the best focus position (z=0) is herein shown. In FIG. 9, a dose at the position surrounded by a circle is the isofocal dose Dp (ISO) of each pattern density. The curve of the pattern dimension CD with respect to the dose in each pattern density shown in FIG. 9 is differentiated. That is, d (pattern dimension CD)/d (dose) is calculated. Thereby, it is possible to calculate a pattern dimension fluctuation amount (dose latitude) at a change of unit dose of the isofocal dose Dp (ISO) in each pattern density.

Figure 10:
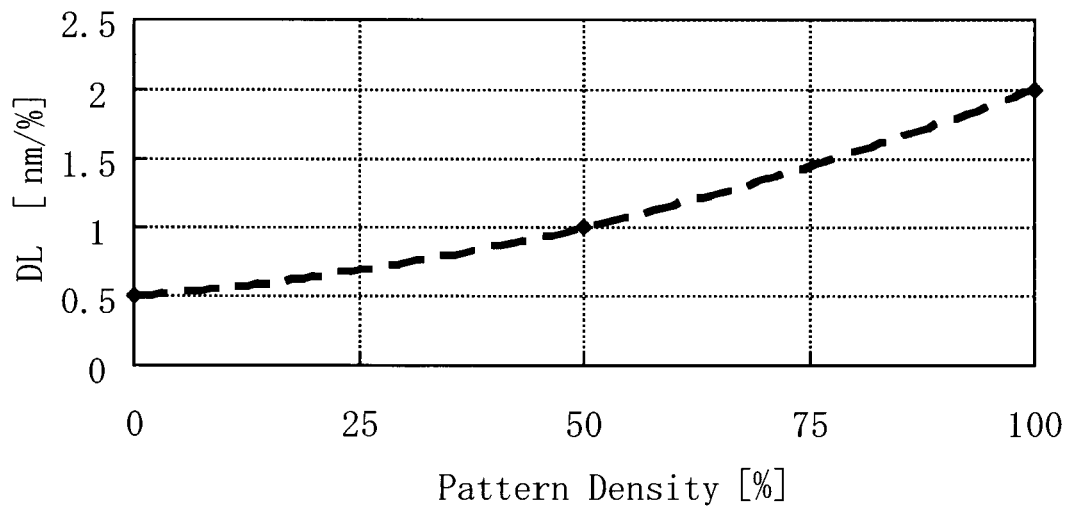
FIG. 10 shows a relation between a pattern density and a dose latitude described in Embodiment 1.

FIG. 10 shows a relation between a pattern density and a dose latitude described in Embodiment 1. In the figure, a calculated dose latitude is shown. The abscissa axis indicates a pattern density and the ordinate axis indicates a dose latitude.

In step S112, as the resizing amount calculation step, a resizing amount which should be processed beforehand for dimensions of a design pattern is calculated for each pattern density. A dimension fluctuation amount for each pattern density can be calculated by multiplying the difference $\Delta Dp$ mentioned above by a dimension fluctuation amount (dose latitude) at a change of unit dose of the isofocal dose. The dimension fluctuation amount for each pattern density serves as a resizing amount A CD.

Figure 11:
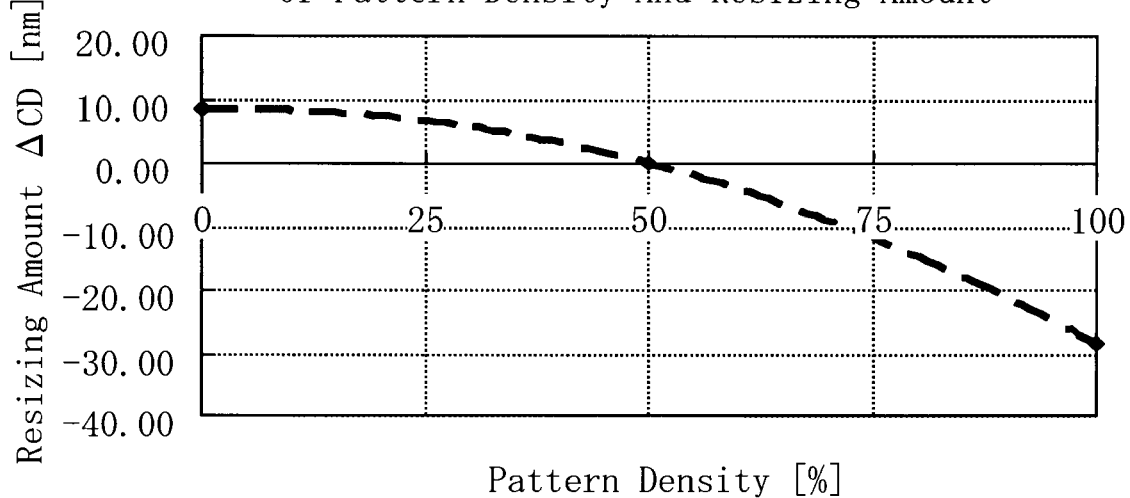
FIG. 11 shows a relation between a pattern density and a resizing amount described in Embodiment 1.

FIG. 11 shows a relation between a pattern density and a resizing amount described in Embodiment 1. In the figure, the abscissa axis indicates a pattern density and the ordinate axis indicates a resizing amount ΔCD. The data shown in FIG. 11 is the correlation data (2) 154 indicating a correlation between a pattern density and a resizing amount.

As mentioned above, the correlation between a pattern density and an isofocal dose and the correlation between a pattern density and a resizing amount are calculated as a preparatory step. Then, the calculated correlation data (1) 152 and correlation data (2) 154 are stored on the magnetic disk drive 109 of the support apparatus 500. Next, using the above data, writing data to be input into the pattern writing apparatus 100 is generated by the support apparatus 500.

In step S202, as the pattern data input step, the control computer 110 inputs pattern data for writing a pattern on the target workpiece 101, through the external I/F 124. The inputted pattern data is stored or "memorized" in a storage device, such as the magnetic disk drive 109. This pattern data is to be design pattern data.

In step S204, as the pattern density calculation step, the pattern density calculation part 112 virtually divides a writing area to be written with the pattern data, into a plurality of mesh-like small areas. It is preferable for the size of the small area to be smaller than the influence range $\sigma_{pec}$ of the proximity effect, about 1/10 of the influence range $\sigma_{pec}$, for example. Then, a pattern density in each small area (mesh area) virtually divided is calculated based on the pattern data. The map creation part 116 assigns the calculated pattern density to each mesh area 30 to create a pattern density map. The created pattern density map is stored in a storage device, such as the memory 122 or the magnetic disk drive 109.

Figure 12:
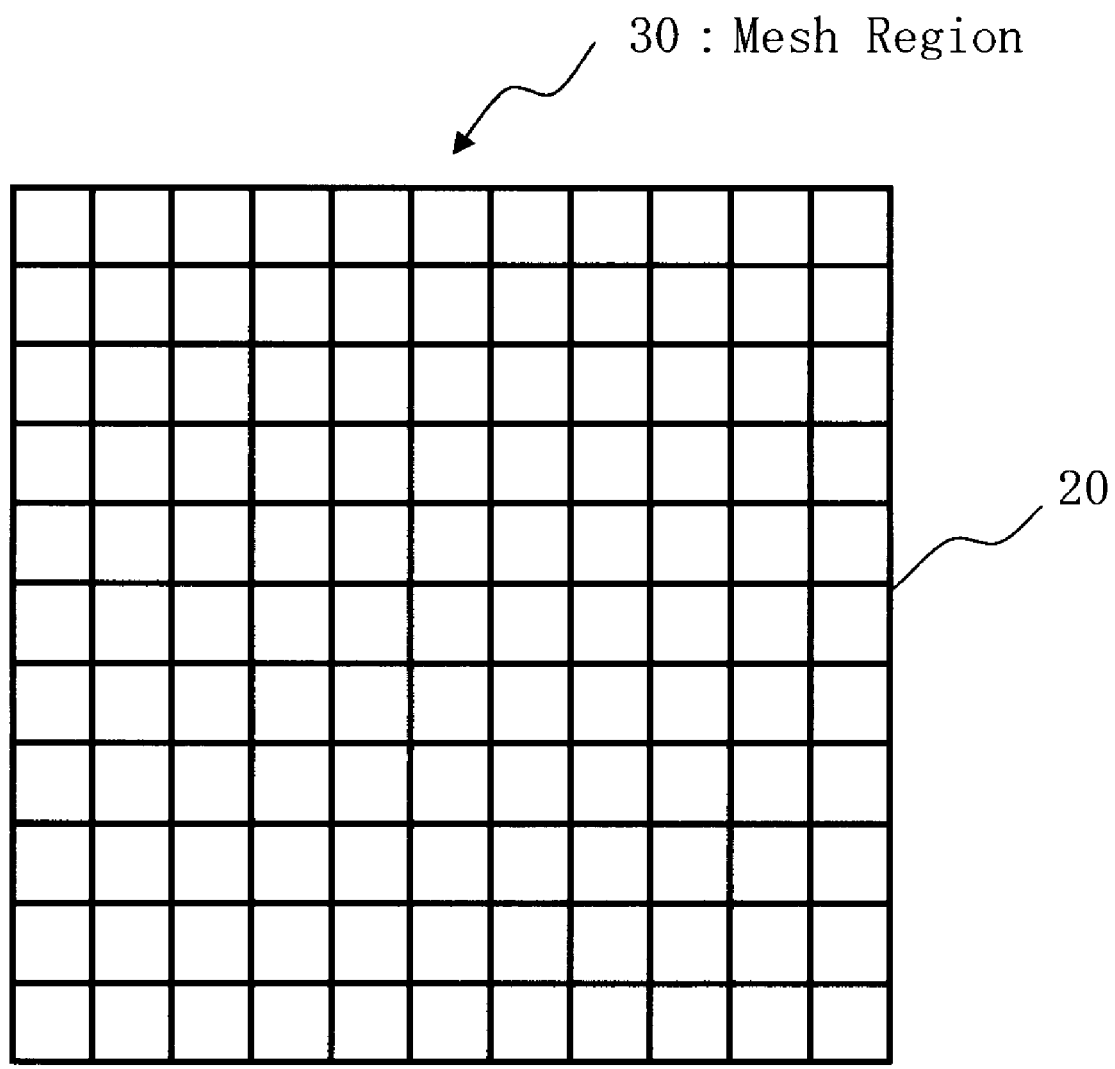
FIG. 12 shows a schematic diagram for explaining a mesh area described in Embodiment 1.

FIG. 12 shows a schematic diagram for explaining a mesh area described in Embodiment 1. In Embodiment 1, as shown in FIG. 12, calculation for a model is performed by virtually dividing a target workpiece 20, such as a mask, into a plurality of small areas 30 (grid areas) in a mesh-like (grid-like or lattice-like) manner of predetermined grid dimensions. For example, in order to suppress a proximity effect correction error to about 0.5%, it is preferable to virtually divide the target workpiece 20 into a plurality of meshes (areas) each having a grid dimension of about 1 μm.

In step S206, as the isofocal dose Dp (ISO) calculation step, the isofocal dose calculation part 114 reads the correlation data (1) 152 relating to a pattern density and an isofocal dose from the magnetic disk drive 109. Then, using the relation indicated by the correlation data (1) 152, an isofocal dose Dp (ISO) of each mesh area 30 is calculated. Since the pattern density in each mesh area 30 has already been calculated, the optimal isofocal dose Dp (ISO) of each mesh area 30 can be calculated based on the correlation shown in FIG. 7.

In step S208, as the dose map creation step, the map creation part 116 assigns the calculated isofocal dose Dp (ISO) to each mesh area 30 to create a dose map. The created dose map is stored in a storage device, such as the memory 122 or the magnetic disk drive 109.

In step S210, as the resizing amount calculation step, the resizing amount calculation part 118 reads the correlation data (2) 154 on a pattern density and a resizing amount from the magnetic disk drive 109. Then, using the correlation information on a pattern density and a resizing amount, a resizing amount of each mesh area 30 is calculated. Since the pattern density in each mesh area 30 has already been calculated, the resizing amount of each mesh area 30 can be calculated based on the correlation shown in FIG. 11.

Figure 13:
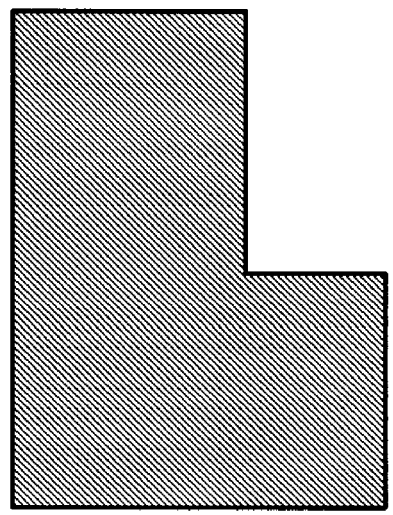
FIG. 13 shows an example of a design pattern included in pattern data before resizing described in Embodiment 1.
Figure 14:
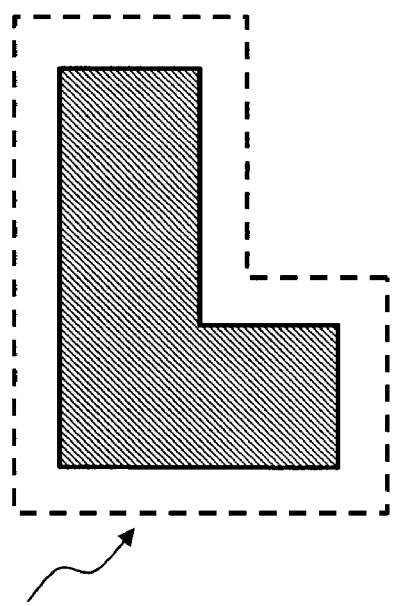
FIG. 14 shows an example of a design pattern included in pattern data after resizing described in Embodiment 1.

In step S212, as the resizing step, the resizing processing part 120 resizes a design pattern dimension located in each mesh area 30 by the resizing amount calculated by the resizing amount calculation part 118 for each mesh area 30. FIG. 13 shows an example of a design pattern included in pattern data before resizing described in Embodiment 1. FIG. 14 shows an example of a design pattern included in pattern data after resizing described in Embodiment 1. For example, by resizing the dimensions of a design pattern 42 shown in FIG. 13, reduced dimensions like a pattern 44 after resizing shown in FIG. 14 can be obtained. Dimensions are reduced by the resizing in this case, but there may be a case of expanding dimensions by resizing depending upon a pattern density. As to the amount of resizing, if patterns are in the same mesh area 30, dimensions of the patterns are resized by the same dimension. Pattern data including resized design pattern is stored in a storage device, such as the memory 122 or the magnetic disk drive 109.

As mentioned above, data of the dose map in which an isofocal dose Dp (ISO) is assigned to each mesh area 30 and resized pattern data which is on patterns resized in each mesh area 30 can be generated as writing data.

In step S214, as the writing data output step, the control computer 110 outputs the writing data to the pattern writing apparatus 100 through the external I/F 124. The writing data includes, as mentioned above, data of the dose map in which an isofocal dose Dp (ISO) is assigned to each mesh area 30 and pattern data which is on patterns resized in each mesh area 30.

In step S216, as the writing step, the control circuit 160 inputs the writing data from the support apparatus 500, and controls each structure of the pattern writing part 150 based on the inputted writing data in order to write a desired pattern on the target workpiece 101. Then, the pattern writing apparatus 100 writes a resized design pattern using the isofocal dose Dp (ISO) which has been assigned to the dose map for each pattern density in each mesh area 30 before resizing.

Since the structure mentioned above makes it possible to write at the isofocal dose, a dimension fluctuation of a pattern at the time of a focal positional deviation error can be controlled. Moreover, since the dimensions of design pattern are resized, the dimension fluctuation amount generated by writing with the isofocal dose can be corrected simultaneously. Consequently, it is possible to write a pattern having no or little dimension fluctuation error.

Embodiment 2

As mentioned above, according to Embodiment 1, the isofocal dose etc. is measured only in the evaluation patterns 12, 14, and 16 shown in FIG. 3. Based on a result of the measuring, the correlation data (1) 152 and the correlation data (2) 154 are generated. Then, based on these data and a pattern density in a mesh in which the proximity effect is taken into consideration, to be explained in detail later, an isofocal dose for the case of writing design pattern data is calculated. A resizing amount is also calculated similarly. If influence around the evaluation patterns 12, 14, and 16 is taken into account, further highly precise isofocal dose etc. can be measured. For this reason, in Embodiment 2, the structure in the case of taking the influence around the evaluation pattern into consideration will be explained. The structures of the support apparatus 500 and the pattern writing apparatus 100 in Embodiment 2 are the same as those of Embodiment 1. Moreover, the steps up to the writing are the same as those of Embodiment 1 except for taking into account an influence of a peripheral pattern.

The electron beam writing method according to Embodiment 2 will be explained hereafter. To begin with, a correlation between a first and a second pattern densities and an isofocal dose is calculated as a preparatory step. The correlation between the first and the second pattern densities and a resizing amount is also calculated. The first pattern density is a pattern density in a mesh-like small area virtually divided to be a size taking the influence of a proximity effect into consideration. Preferably, the size of the first pattern density is smaller than the influence range $\sigma_{pec}$ of the proximity effect, for example about 1/10 of the influence range $\sigma_{pec}$, as mentioned above. For example, it is preferable to use the size of 1 µm in the directions X and Y respectively. This small area in which the proximity effect is taken into consideration is hereafter called a proximity effect mesh or a proximity effect area. On the other hand, the second pattern density is a pattern density in a mesh-like small area virtually divided to be a size taking influence of peripheral patterns into consideration. Preferably, the size of the second pattern density is smaller than the influence range $\sigma_{global}$ of the fogging or the loading effect, for example about 1/10 of the influence range $\sigma_{global}$. For example, it is preferable to use the size of 500 µm in the directions X and Y respectively. This small area is hereafter called a global mesh or a global area.

In step 102, as the isofocal dose Dp (ISO) measurement step for each pattern density, an isofocal dose Dp (ISO) is measured for each pattern with respect to patterns of a plurality of pattern densities with various first and second pattern densities. That is, an isofocal dose Dp (ISO) is measured for each combination of the first and the second pattern densities.

Figure 15:
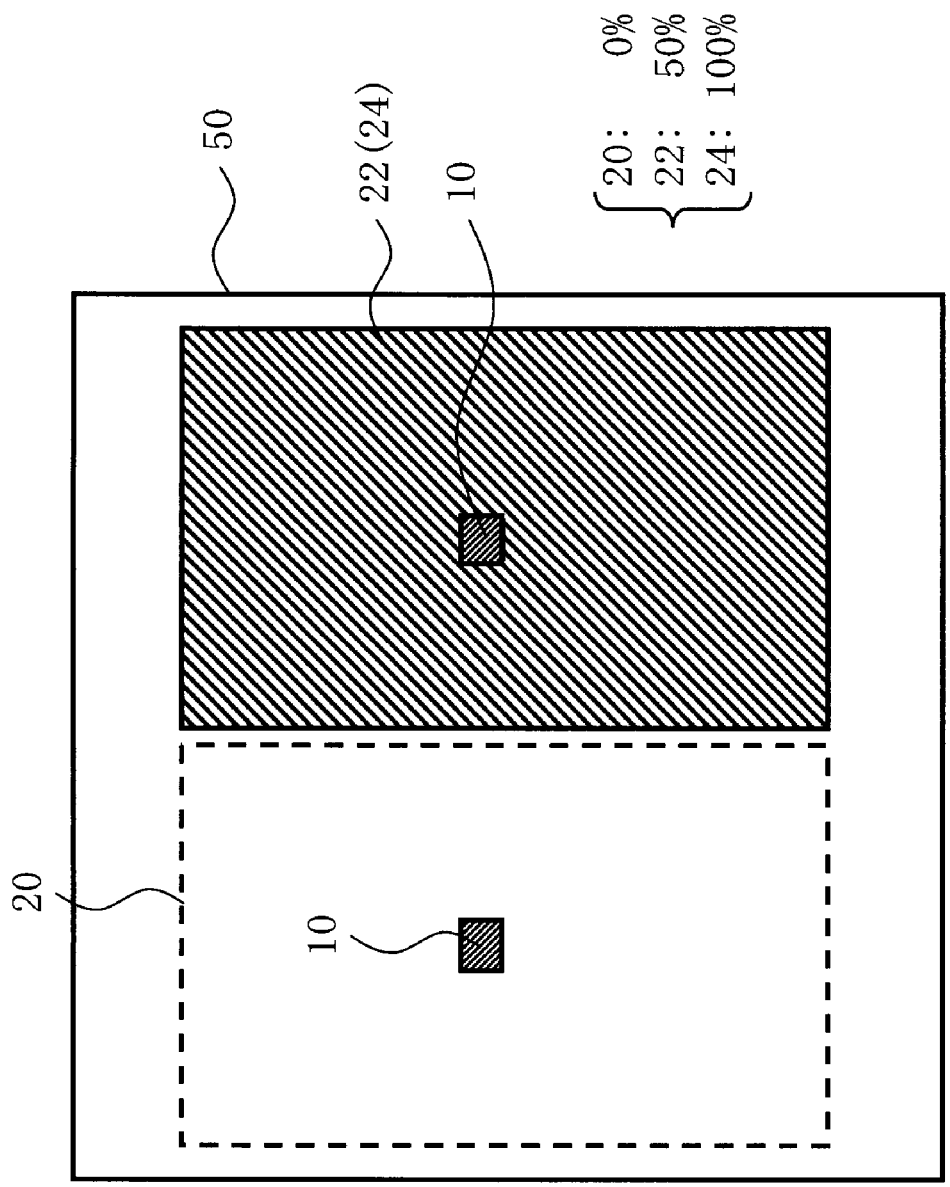
FIG. 15 shows an example of an evaluation pattern described in Embodiment 2.

FIG. 15 shows an example of an evaluation pattern described in Embodiment 2. A global evaluation pattern composed of the set of evaluation patterns 12-16 shown in FIG. 3 and three types of peripheral patterns around the set of evaluation patterns 12-16 are written on an evaluation substrate 50, as an example. The first global evaluation pattern is a global evaluation pattern 20 in which the pattern density of the peripheral pattern around the set of evaluation patterns 12-16 can be regarded as about 0%. The second global evaluation pattern is a global evaluation pattern 22 in which the pattern density of the peripheral pattern around the set of evaluation patterns 12-16 is 50%. The third global evaluation pattern is a global evaluation pattern 24 in which the pattern density of the peripheral pattern can be regarded as about 100%. FIG. 15 shows two patterns, the global evaluation pattern 20 and the global evaluation pattern 22. That is, the two patterns, the global evaluation pattern 20 and the global evaluation pattern 22, are written on this evaluation substrate 50. Moreover, on another evaluation substrate 50 of the same type, the global evaluation pattern 20 and the global evaluation pattern 24 are written. The combination of global evaluation patterns to be written on each evaluation substrate 50 is not restricted to these. What is necessary is just to write three global evaluation patterns 20, 22, and 24. If an area for the peripheral pattern is securable, three global evaluation patterns 20, 22, and 24 may be written on the same substrate. For example, when the size of the set of evaluation patterns 12-16 is 500 square µm, it is preferable for the size of the global evaluation pattern to be 4 square cm or more. What is required is just to prepare a peripheral pattern having about 2 cm from the periphery of the evaluation pattern 10. The optimal isofocal dose Dp (ISO) in each evaluation pattern is measured while changing a focal position and a dose by the pattern writing apparatus 100, using the evaluation substrate 50 on which resist film is applied. In the measuring, a pattern width dimension CD shown in FIG. 3 of a resist pattern for which writing and processing procedures have been performed is measured.

In step S104, as the proximity effect correction dose Dp (PEC) measurement step for each pattern density, a proximity effect correction dose Dp (PEC) is measured while changing pattern densities in a global area and a proximity effect area. The measuring is performed for each pattern density with respect to patterns of a plurality of pattern densities. Similar to the case of measuring the isofocal dose Dp (ISO), a proximity effect correction dose Dp (PEC) is measured while changing a focal position and a dose by the pattern writing apparatus 100, using the evaluation substrate 50 on which resist film is applied. In the measuring, a pattern width dimension CD shown in FIG. 3 of a resist pattern for which writing and processing procedures have been performed is measured like the above case.

Figure 16:
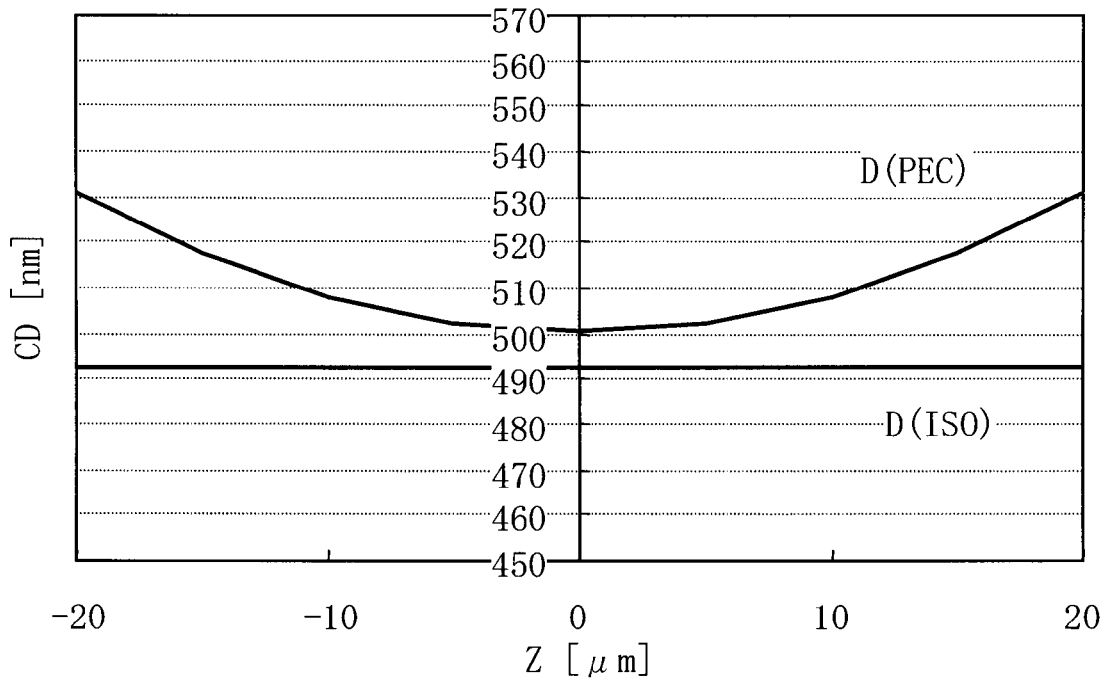
FIG. 16 shows a relation between a focal position and a pattern width dimension with respect to the isofocal dose and the proximity effect correction dose in a proximity effect area with a pattern density of 0% and a global area with a pattern density of 0% described in Embodiment 2.

FIG. 16 shows a relation between a focal position and a pattern width dimension with respect to the isofocal dose and the proximity effect correction dose in a proximity effect area with a pattern density of 0% and a global area with a pattern density of 0% described in Embodiment 2.

Figure 17:
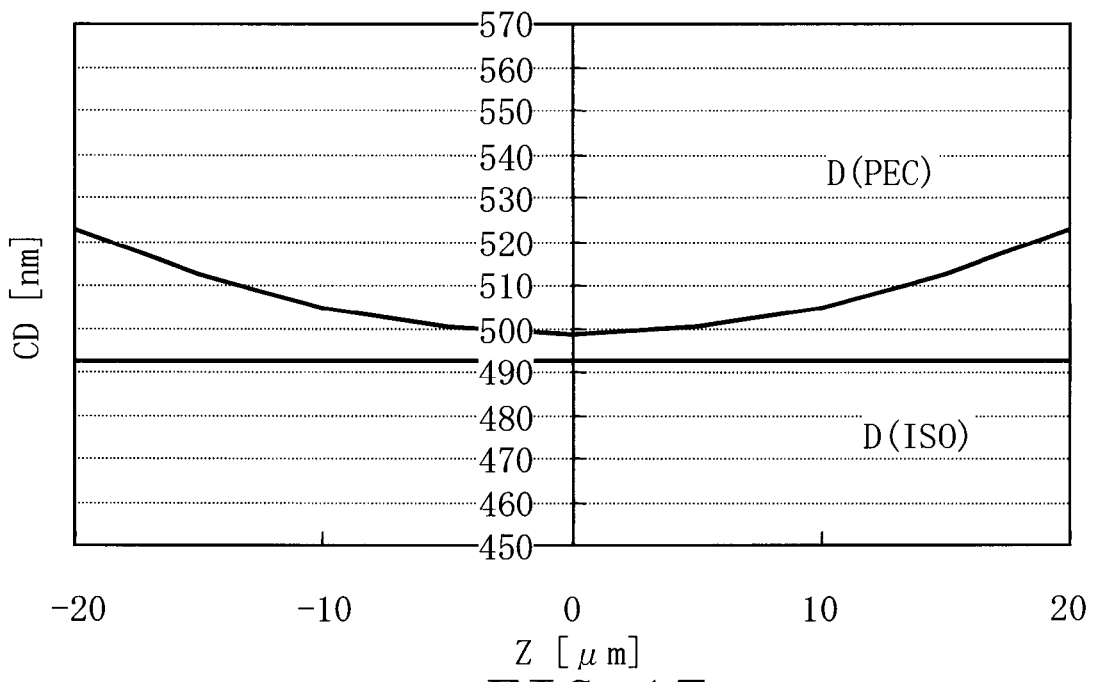
FIG. 17 shows a relation between a focal position and a pattern width dimension with respect to the isofocal dose and the proximity effect correction dose in a proximity effect area with a pattern density of 0% and a global area with a pattern density of 50% described in Embodiment 2.

FIG. 17 shows a relation between a focal position and a pattern width dimension with respect to the isofocal dose and the proximity effect correction dose in a proximity effect area with a pattern density of 0% and a global area with a pattern density of 50% described in Embodiment 2.

Figure 18:
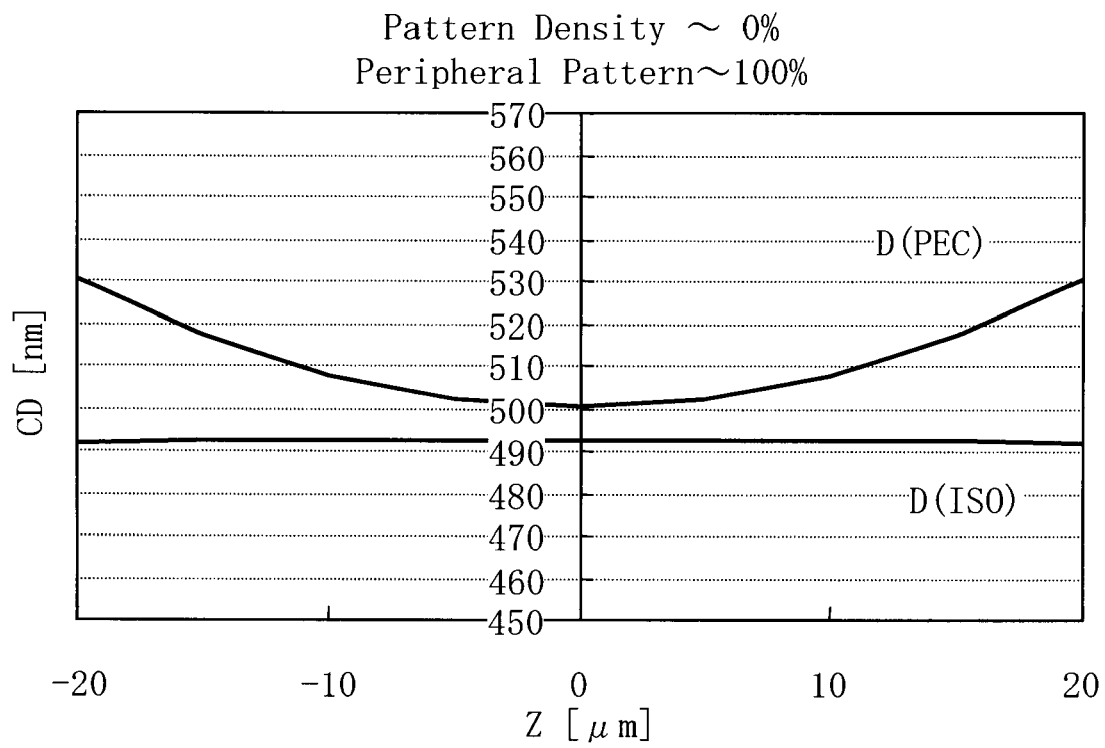
FIG. 18 shows a relation between a focal position and a pattern width dimension with respect to the isofocal dose and the proximity effect correction dose in a proximity effect area with a pattern density of 0% and a global area with a pattern density of 100% described in Embodiment 2.

FIG. 18 shows a relation between a focal position and a pattern width dimension with respect to the isofocal dose and the proximity effect correction dose in a proximity effect area with a pattern density of 0% and a global area with a pattern density of 100% described in Embodiment 2.

Figure 19:
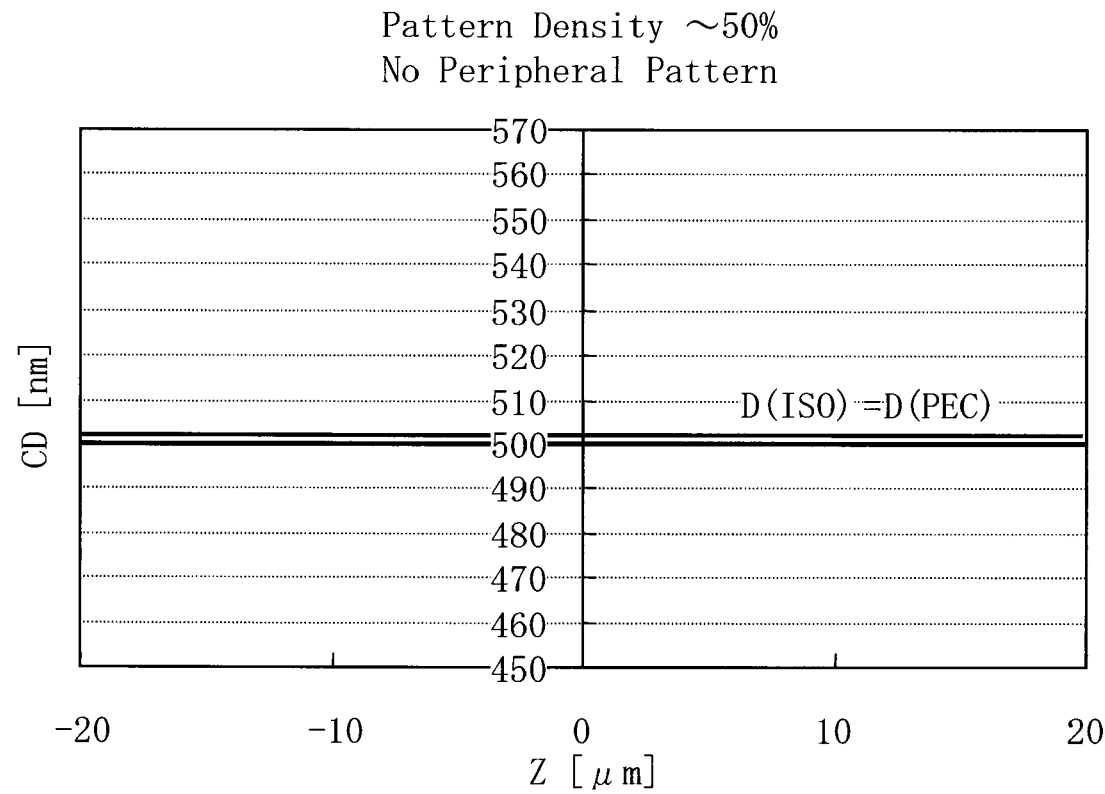
FIG. 19 shows a relation between a focal position and a pattern width dimension with respect to the isofocal dose and the proximity effect correction dose in a proximity effect area with a pattern density of 50% and a global area with a pattern density of 0% described in Embodiment 2.

FIG. 19 shows a relation between a focal position and a pattern width dimension with respect to the isofocal dose and the proximity effect correction dose in a proximity effect area with a pattern density of 50% and a global area with a pattern density of 0% described in Embodiment 2.

Figure 20:
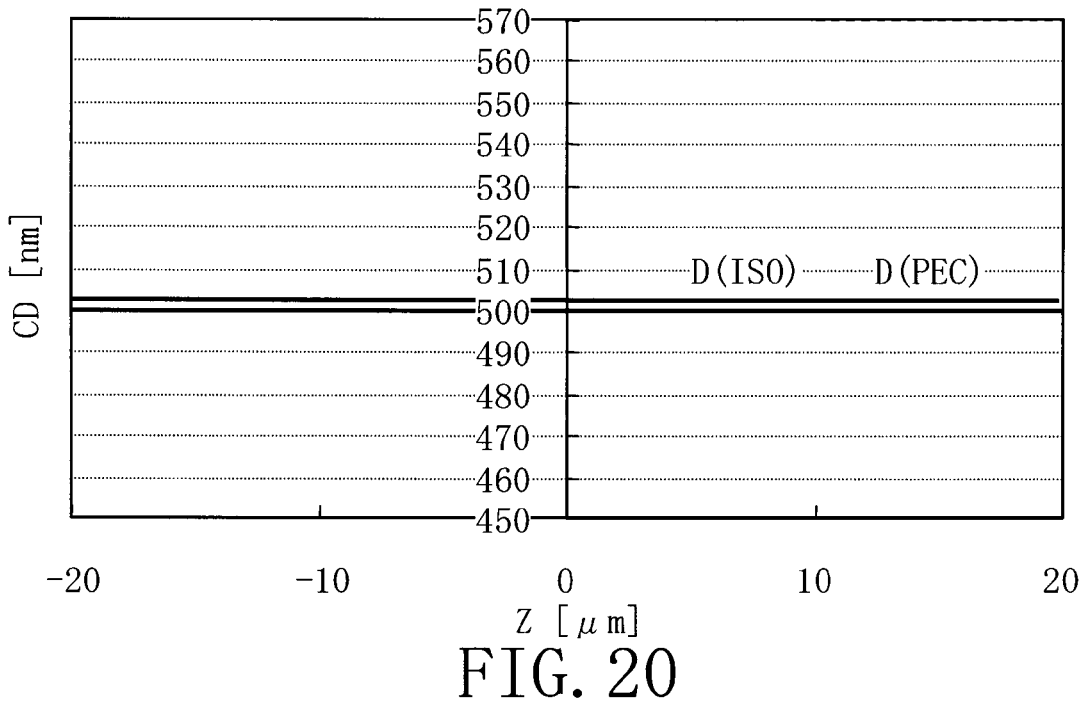
FIG. 20 shows a relation between a focal position and a pattern width dimension with respect to the isofocal dose and the proximity effect correction dose in a proximity effect area with a pattern density of 50% and a global area with a pattern density of 50% described in Embodiment 2.

FIG. 20 shows a relation between a focal position and a pattern width dimension with respect to the isofocal dose and the proximity effect correction dose in a proximity effect area with a pattern density of 50% and a global area with a pattern density of 50% described in Embodiment 2.

Figure 21:
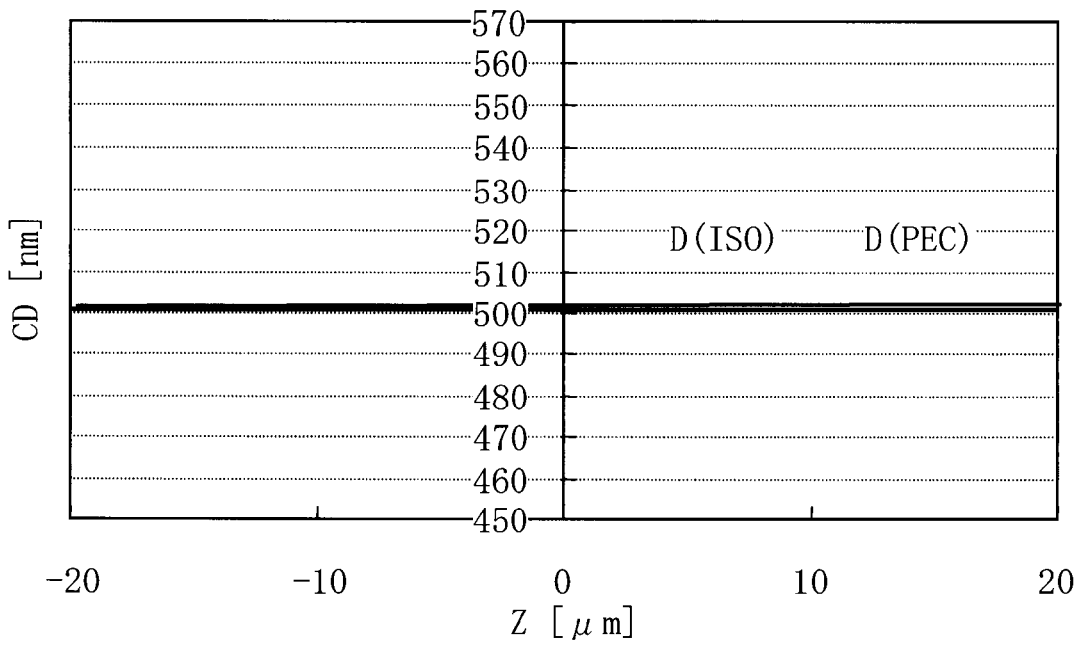
FIG. 21 shows a relation between a focal position and a pattern width dimension with respect to the isofocal dose and the proximity effect correction dose in a proximity effect area with a pattern density of 50% and a global area with a pattern density of 100% described in Embodiment 2.

FIG. 21 shows a relation between a focal position and a pattern width dimension with respect to the isofocal dose and the proximity effect correction dose in a proximity effect area with a pattern density of 50% and a global area with a pattern density of 100% described in Embodiment 2.

Figure 22:
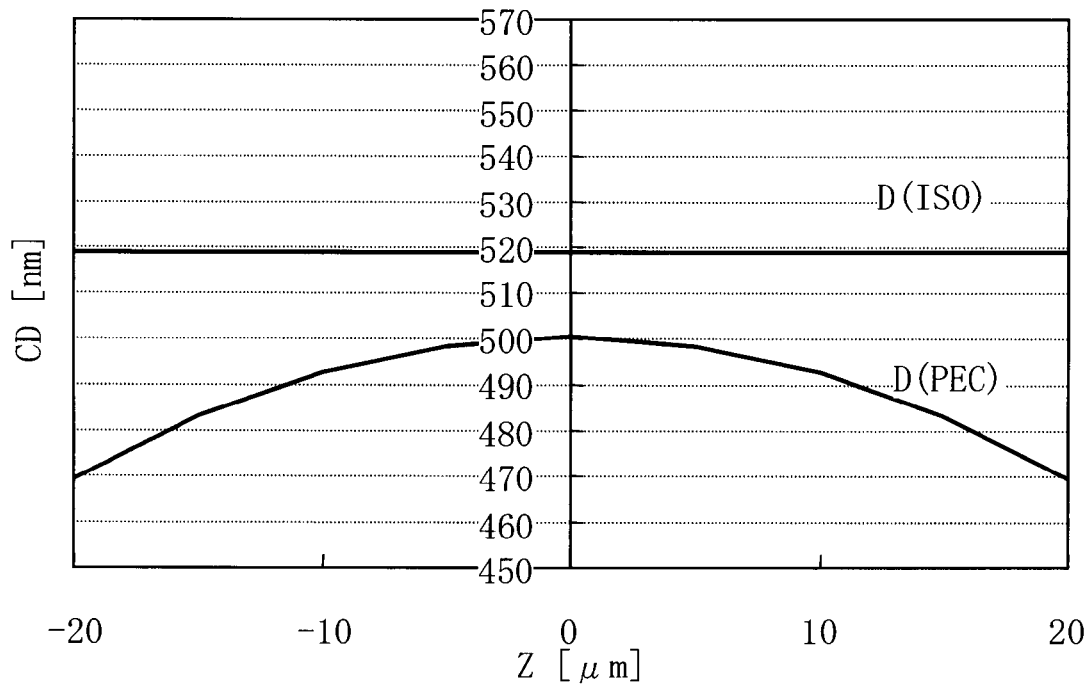
FIG. 22 shows a relation between a focal position and a pattern width dimension with respect to the isofocal dose and the proximity effect correction dose in a proximity effect area with a pattern density of 100% and a global area with a pattern density of 0% described in Embodiment 2.

FIG. 22 shows a relation between a focal position and a pattern width dimension with respect to the isofocal dose and the proximity effect correction dose in a proximity effect area with a pattern density of 100% and a global area with a pattern density of 0% described in Embodiment 2.

Figure 23:
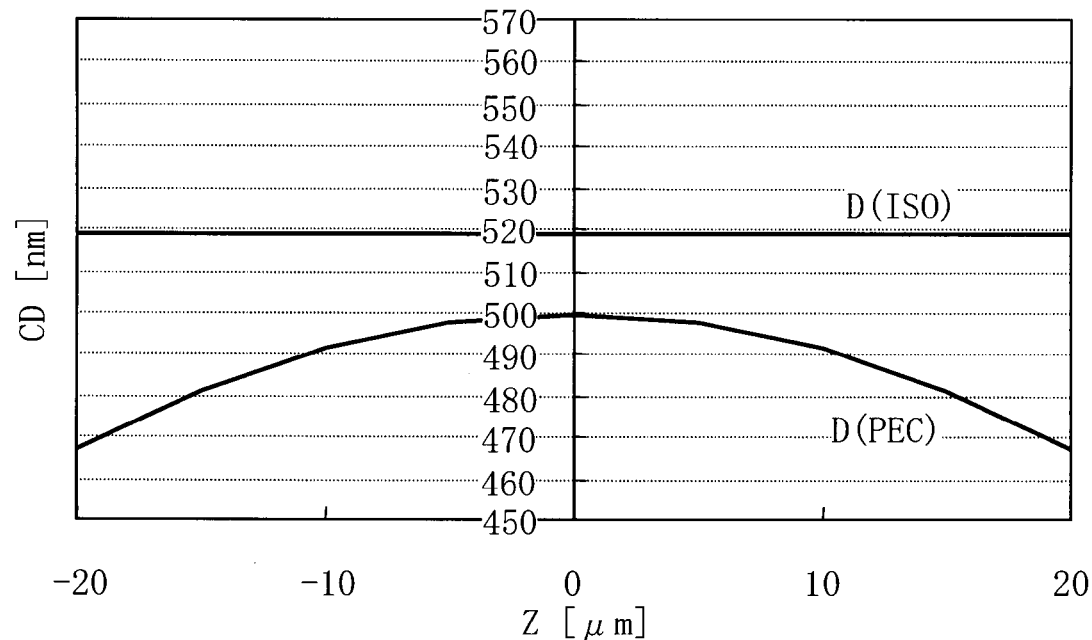
FIG. 23 shows a relation between a focal position and a pattern width dimension with respect to the isofocal dose and the proximity effect correction dose in a proximity effect area with a pattern density of 100% and a global area with a pattern density of 50% described in Embodiment 2.

FIG. 23 shows a relation between a focal position and a pattern width dimension with respect to the isofocal dose and the proximity effect correction dose in a proximity effect area with a pattern density of 100% and a global area with a pattern density of 50% described in Embodiment 2.

Figure 24:
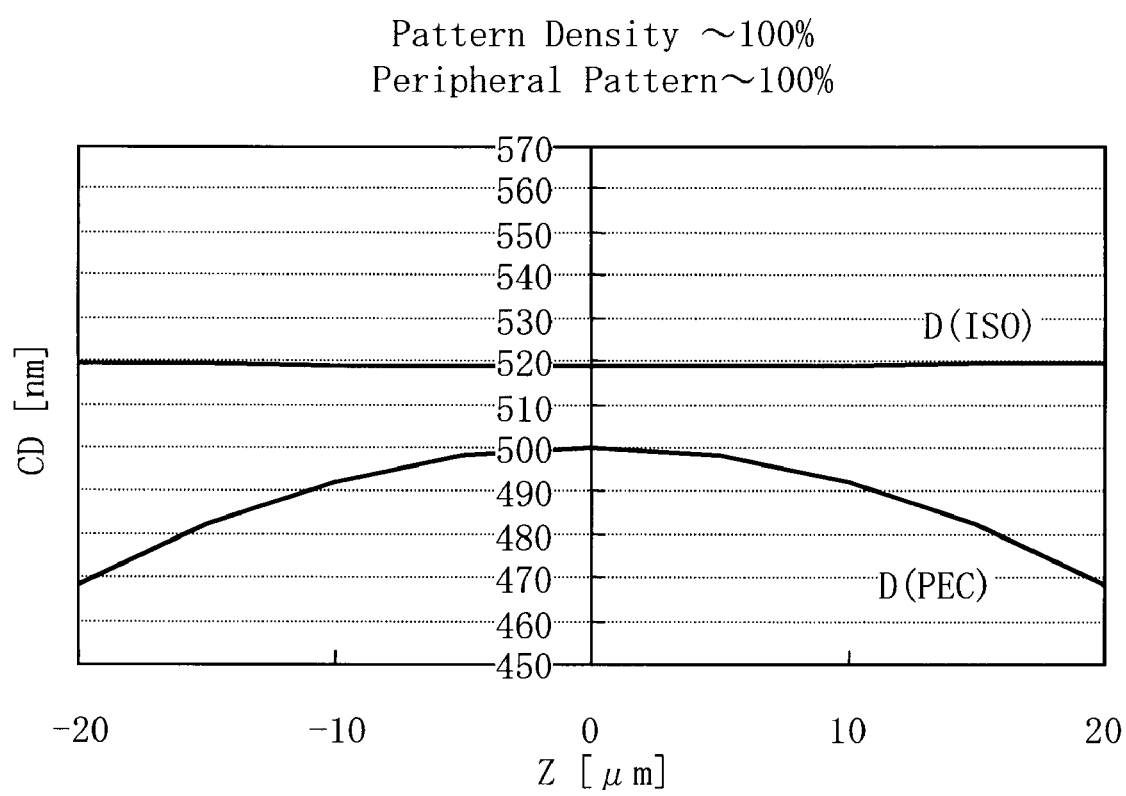
FIG. 24 shows a relation between a focal position and a pattern width dimension with respect to the isofocal dose and the proximity effect correction dose in a proximity effect area with a pattern density of 100% and a global area with a pattern density of 100% described in Embodiment 2.

FIG. 24 shows a relation between a focal position and a pattern width dimension with respect to the isofocal dose and the proximity effect correction dose in a proximity effect area with a pattern density of 100% and a global area with a pattern density of 100% described in Embodiment 2.

In FIGS. 16 to 24, the abscissa axis indicates a focal position (defocusing amount) and the ordinate axis indicates a pattern width dimension as well as FIGS. 4 to 6.

Figure 25:
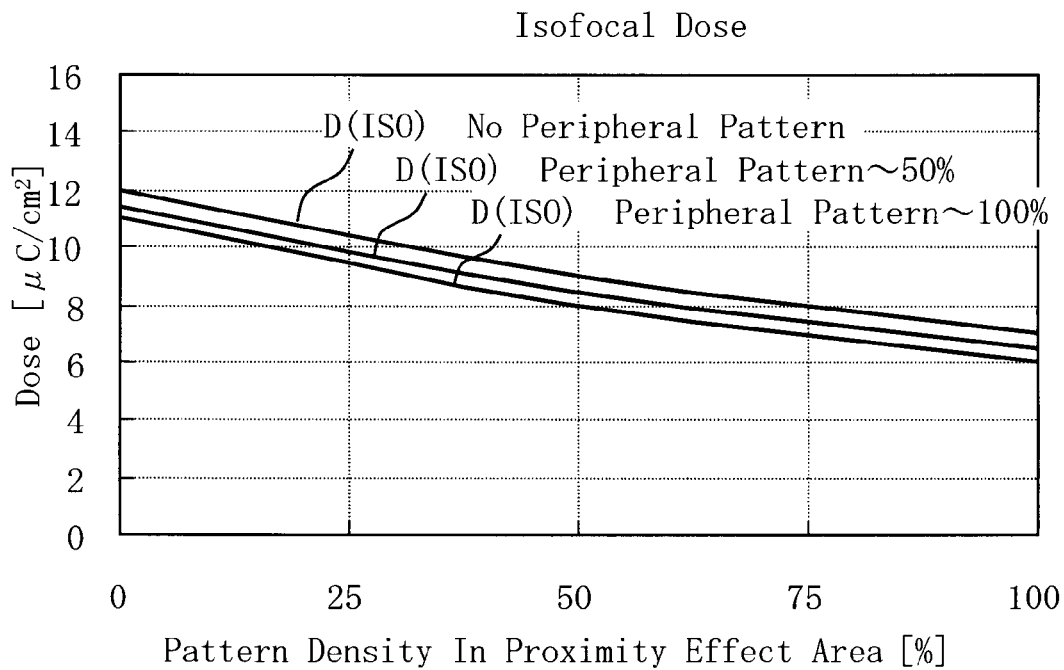
FIG. 25 shows a relation between an isofocal dose and pattern densities in a global area and a proximity effect area described in Embodiment 2.

FIG. 25 shows a relation between an isofocal dose and pattern densities in a global area and a proximity effect area described in Embodiment 2. In the figure, the isofocal dose Dp (ISO) at the best focus position in each pattern density is shown. It can be understood that the dose Dp (ISO) in each pattern density in the proximity effect area varies depending upon a pattern density in the global area. Moreover, the data of the isofocal dose in FIG. 25 is also correlation data indicating a correlation between pattern densities in the global area and the proximity effect area and the isofocal dose. Although FIG. 25 shows a two-dimensional graph to be easily viewed, it is three-dimensional correlation data in which each axis indicates a dose Dp (ISO), a pattern density in the proximity effect area, and a pattern density in the global area respectively. This correlation data is stored on the magnetic disk drive 109 as the correlation data (1) 152 in Embodiment 2.

Figure 26:
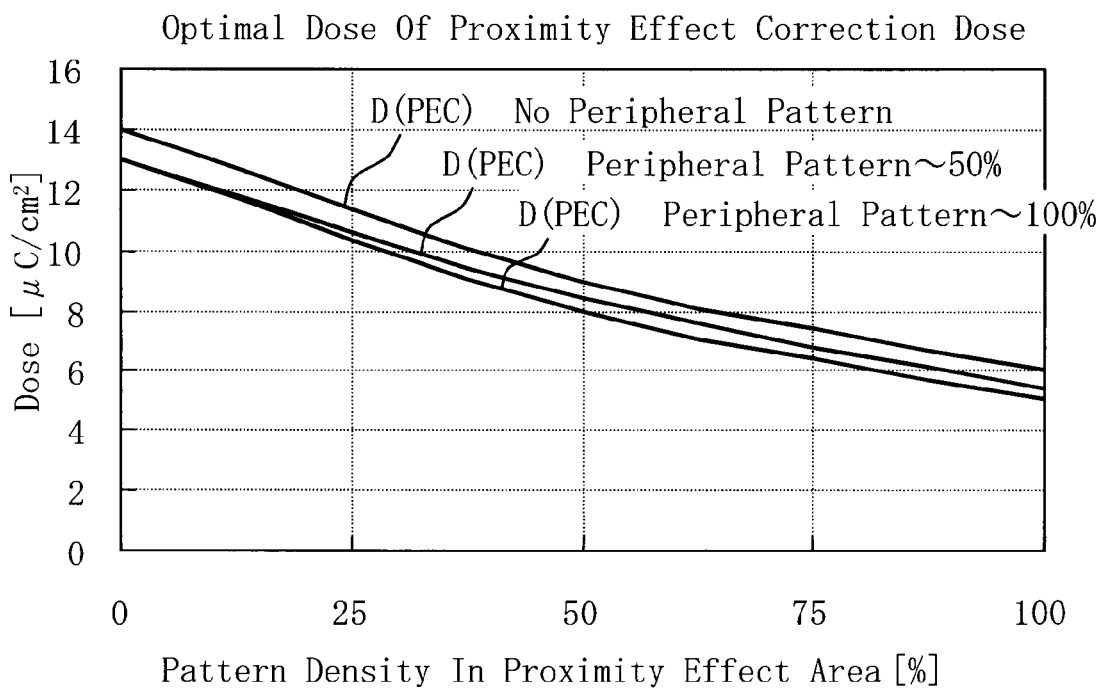
FIG. 26 shows a relation between a proximity effect correction dose and pattern densities in a global area and a proximity effect area described in Embodiment 2.

FIG. 26 shows a relation between a proximity effect correction dose and pattern densities in a global area and a proximity effect area described in Embodiment 2. In the figure, a proximity effect correction dose Dp (PEC) at the best focus position in each pattern density is shown. It can be understood that the dose Dp (PEC) in each pattern density in the proximity effect area also varies depending upon a pattern density in the global area.

In step S106, as the difference calculation step, a difference ΔDp between an isofocal dose Dp (ISO) and a proximity effect correction dose Dp (PEC) for each combination of pattern densities in a global area and a proximity effect area is calculated.

In step S110, as the dose latitude calculation step, a pattern dimension fluctuation amount (=dose latitude) at a change of unit dose of the isofocal dose Dp (ISO) in each combination of pattern densities in a global area and a proximity effect area is calculated. The calculation method of the dose latitude is the same as that of Embodiment 1.

In step S112, as the resizing amount calculation step, a resizing amount which should be processed beforehand for dimensions of a design pattern is calculated for each combination of pattern densities in a global area and a proximity effect area. A dimension fluctuation amount for each combination of pattern densities can be calculated by multiplying the difference ΔDp mentioned above by a dimension fluctuation amount (dose latitude) at a change of unit dose of the isofocal dose. The dimension fluctuation amount for each combination of pattern densities serves as a resizing amount ΔCD.

Figure 27:
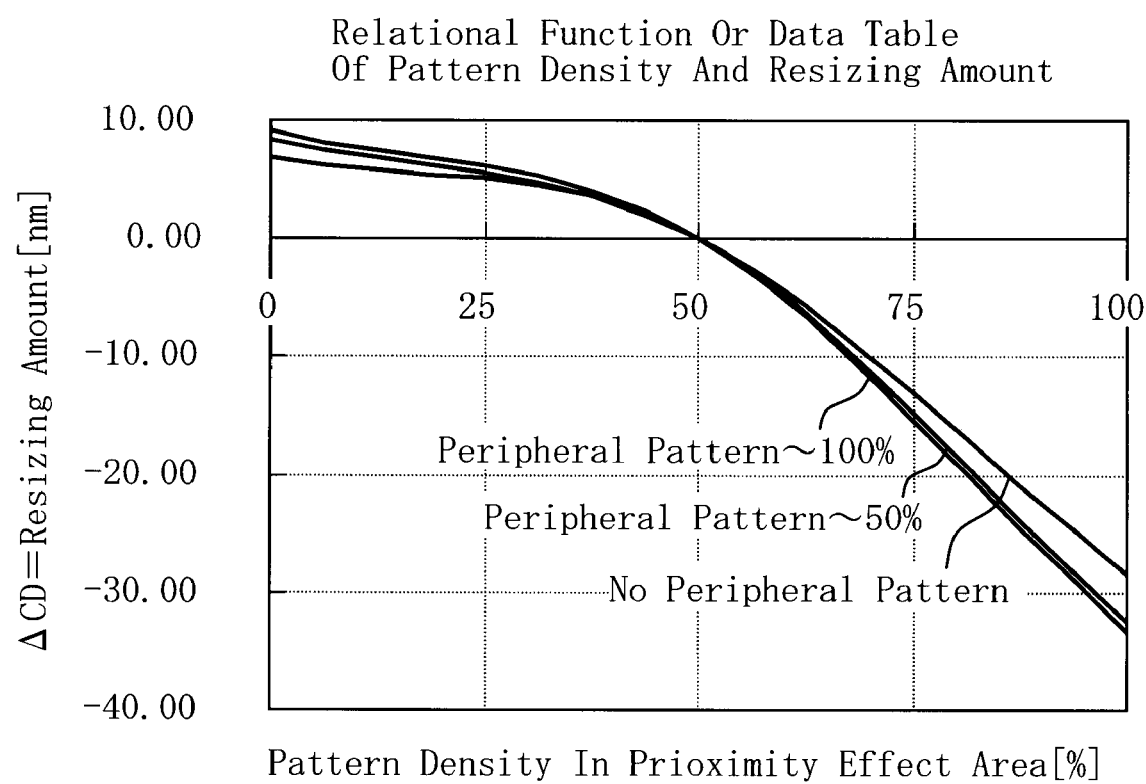
FIG. 27 shows a relation between a combination of pattern densities and a resizing amount described in Embodiment 2.
Figure 28:
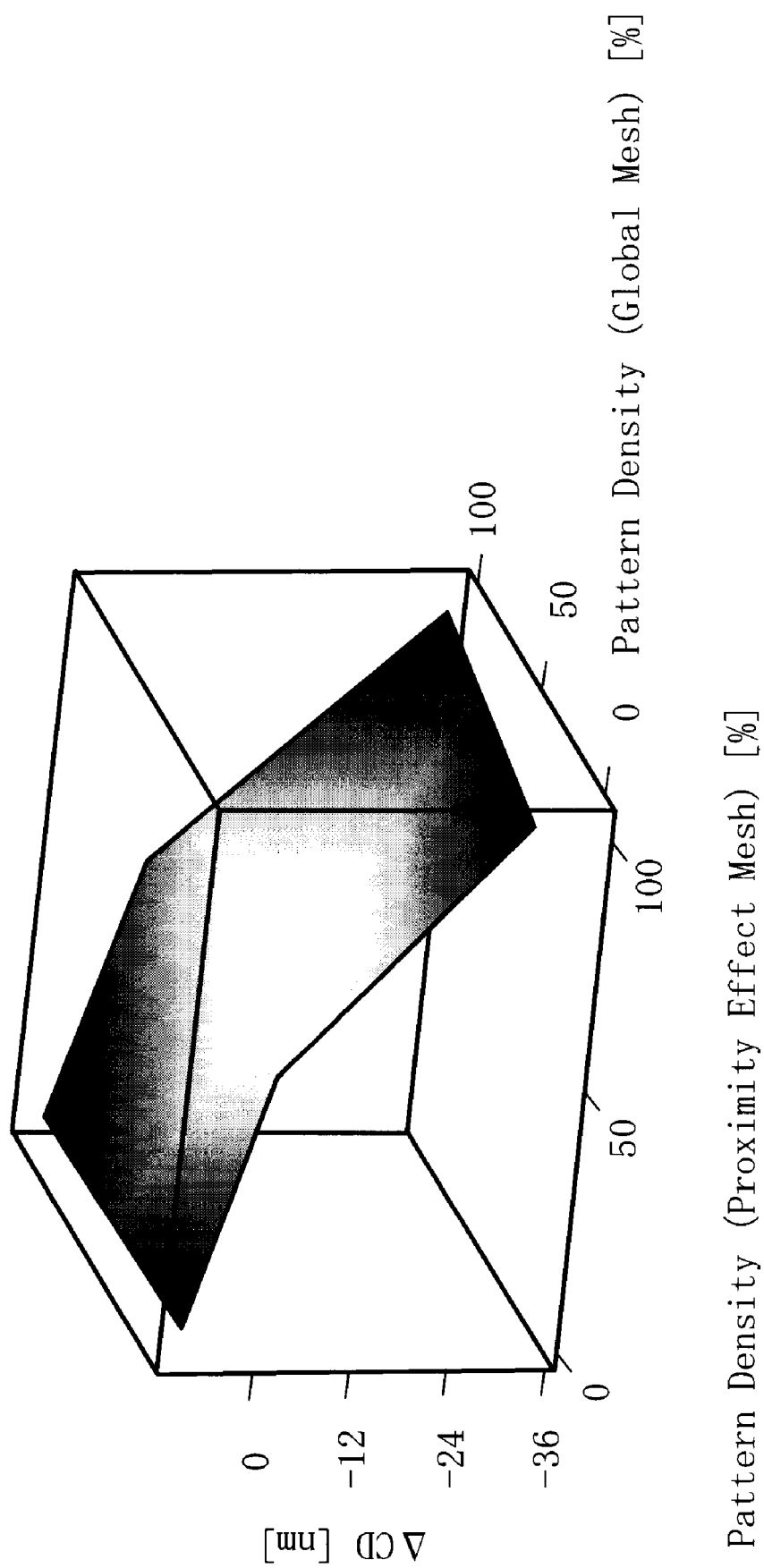
FIG. 28 shows a three-dimensional correlation between a combination of pattern densities and a resizing amount described in Embodiment 2.

FIG. 27 shows a relation between a combination of pattern densities and a resizing amount described in Embodiment 2. In the figure, the abscissa axis indicates a pattern density in a proximity effect area and the ordinate axis indicates a resizing amount ΔCD. FIG. 27 shows the pattern densities of 0%, 50%, and 100% in a global area in order to be easily viewed. FIG. 28 shows a three-dimensional correlation between a combination of pattern densities and a resizing amount described in Embodiment 2. Although FIG. 27 shows a two-dimensional graph to be easily viewed, it is three-dimensional correlation data as shown in FIG. 28 in which a correlation among a resizing amount, a pattern density in a proximity effect area, and a pattern density in a global area is indicated by the axes. This correlation data is stored on the magnetic disk drive 109 as the correlation data (2) 154 according to Embodiment 2.

As the preparatory step as mentioned above, a correlation between a combination of pattern densities in a global area and a proximity effect area and an isofocal dose, and a correlation between a combination of pattern densities in a global area and a proximity effect area and a resizing amount are calculated. Next, using the above data, writing data to be input into the pattern writing apparatus 100 is generated by the support apparatus 500.

In step S202, as the pattern data input step, the control computer 110 inputs pattern data (design pattern data) for writing a pattern on the target workpiece 101. The inputted pattern data is stored in a storage device, such as the magnetic disk drive 109.

In step S204, as the pattern density calculation step, the pattern density calculation part 112 virtually divides a writing area to be written with the pattern data, into a plurality of mesh-like global areas. Similarly, the pattern density calculation part 112 virtually divides the writing area into a plurality of mesh-like proximity effect areas.

Figure 29:
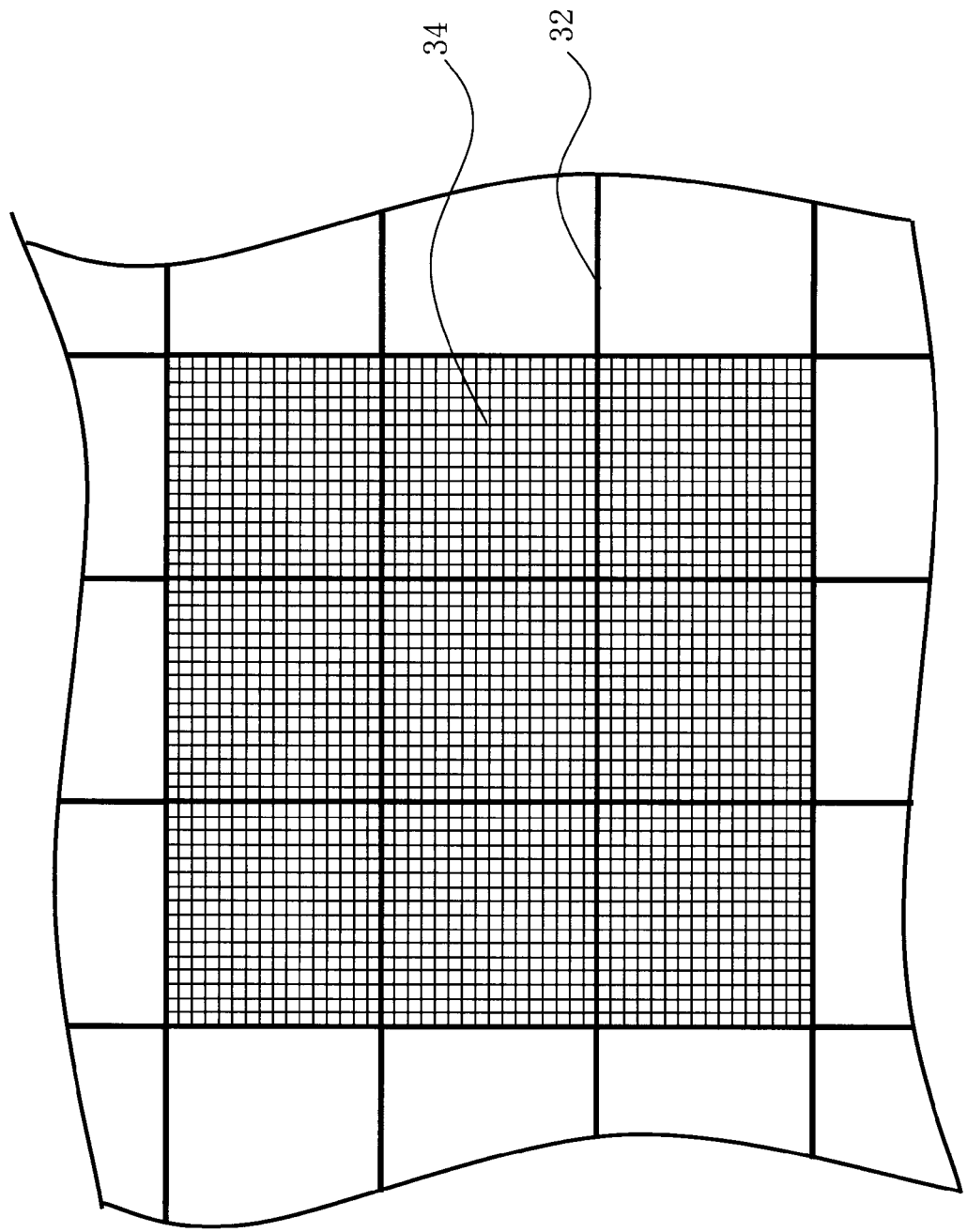
FIG. 29 shows a schematic diagram for explaining a mesh area described in Embodiment 2.
Figure 30:
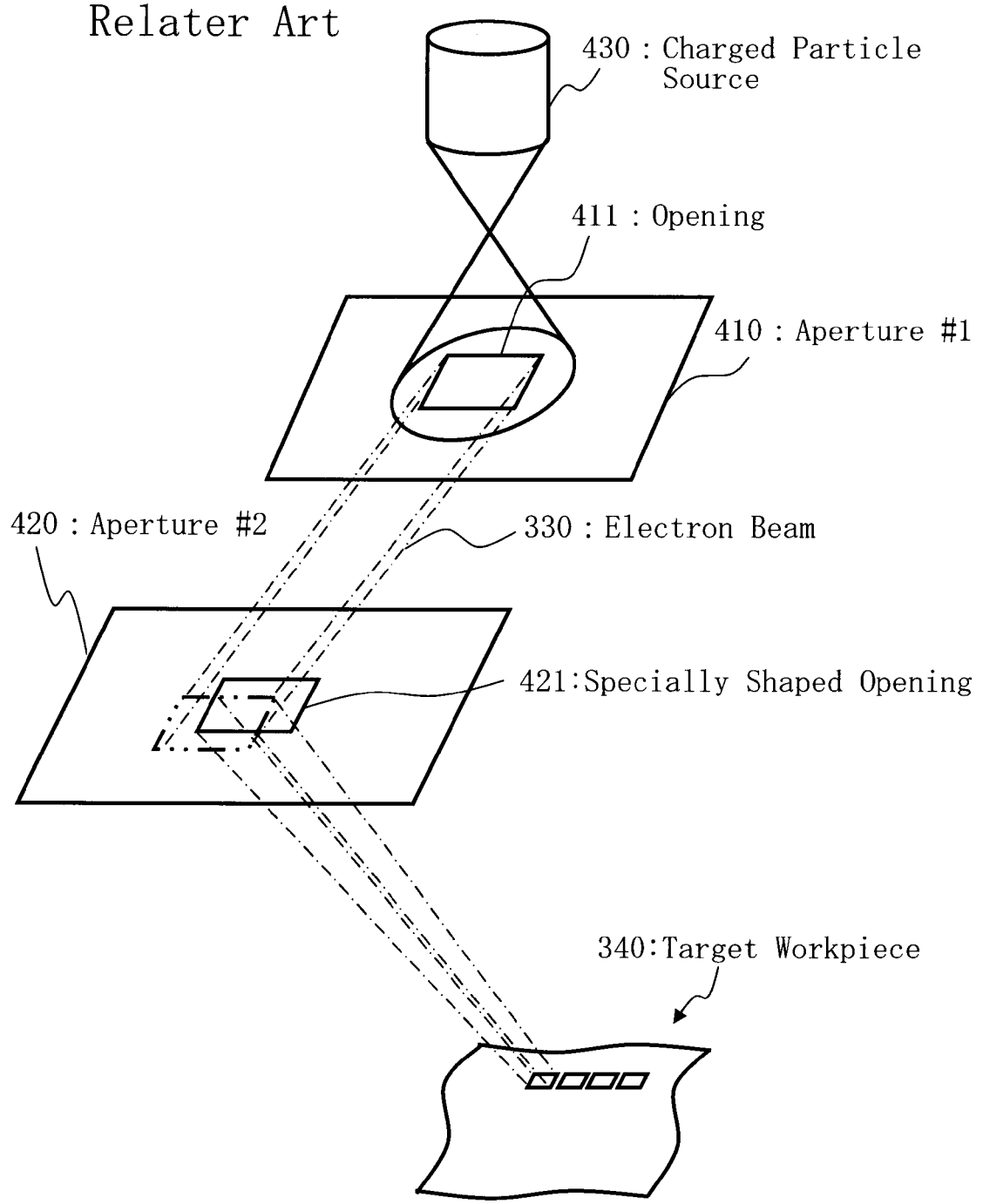
FIG. 30 shows a schematic diagram for explaining operations of a conventional variable-shaped electron beam pattern writing apparatus.

FIG. 29 shows a schematic diagram for explaining a mesh area described in Embodiment 2. In Embodiment 2, as shown in FIG. 29, a model is calculated by virtually dividing a target workpiece, such as a mask, into a mesh area (grid area) which is composed of a plurality of small areas in a mesh-like (grid-like or lattice-like) manner of predetermined grid dimensions. For example, it may be virtually divided into meshes (areas) each having a grid dimension of about 500 μm as a global area. Moreover, it may be virtually divided into meshes (areas) each having a grid dimension of about 1 μm as a proximity effect area.

The pattern density calculation part 112 calculates a pattern density in each global area based on pattern data. Pattern density $\rho_{global}(x)$ in a global area can be calculated based on the following equation (1). Although the equation is formed with respect to the x direction herein to be easily understood, the y direction also needs to be taken into consideration.

[Equation 1]

$$\rho_{global}(x) = \frac{1}{\pi\sigma_{global}^2} \int_{pattern} \exp\left(\frac{(x-x')^2}{\sigma_{global}^2}\right) dx' \qquad (1)$$

The map creation part 116 assigns the calculated pattern density in the global area to each mesh area to create a pattern density map. The created pattern density map of the global area is stored in a storage device, such as the memory 122 or the magnetic disk drive 109. Similarly, the pattern density calculation part 112 calculates a pattern density in each proximity effect area based on the pattern data. Pattern density $\rho_{pec}(x)$ in a proximity effect area can be calculated based on the following equation (2). Although the equation is formed with respect to the x direction herein to be easily understood, the y direction also needs to be taken into consideration.

[Equation 2]

$$\rho_{pec}(x) = \frac{1}{\pi\sigma_{pec}^2} \int_{pattern} \exp\left(\frac{(x-x')^2}{\sigma_{pec}^2}\right) dx' \qquad (2)$$

The map creation part 116 assigns the calculated pattern density in the proximity effect area to each mesh area to create a pattern density map. The created pattern density map of the proximity effect area is also stored in the storage device, such as the memory 122 or the magnetic disk drive 109.

In step S206, as the isofocal dose Dp (ISO) calculation step, the isofocal dose calculation part 114 reads the correlation data (1) 152 on a pattern density and an isofocal dose from the magnetic disk drive 109. Then, using the relation indicated by the correlation data (1) 152, an isofocal dose Dp (ISO) corresponding to a combination of pattern densities in a global area and a proximity effect area is calculated In step S208, as the dose map creation step, the map creation part 116 assigns the isofocal dose Dp (ISO) calculated by the isofocal dose calculation part 114 to each proximity effect area to create a dose map. The created dose map is stored in a storage device, such as the memory 122 or the magnetic disk drive 109.

In step S210, as the resizing amount calculation step, the resizing amount calculation part 118 reads the correlation data (2) 154 on a correlation between pattern densities in a global area and a proximity effect area and a resizing amount from the magnetic disk drive 109. Then, using the correlation information, a resizing amount with respect to a combination of pattern densities in a global area and a proximity effect area is calculated for each proximity effect area.

In step S212, as the resizing step, the resizing processing part 120 resizes a design pattern dimension located in each proximity effect area by the resizing amount calculated by the resizing amount calculation part 118 for each proximity effect area.

As mentioned above, writing data can be generated by using data of a dose map in which an isofocal dose Dp (ISO) calculated with taking a pattern density in a global area into consideration is assigned to each proximity effect area, and pattern data in each proximity effect area generated by performing resizing with taking a pattern density in the global area into consideration.

In step S214, as the writing data output step, the control computer 110 outputs the writing data mentioned above to the pattern writing apparatus 100.

In step S216, as the writing step, the control circuit 160 inputs the writing data from the support apparatus 500, and controls each structure of the pattern writing part 150 based on the inputted writing data in order to write a desired pattern on the target workpiece 101. Then, the pattern writing apparatus 100 writes a resized design pattern using the isofocal dose Dp (ISO) which has been assigned to the dose map for each combination of pattern densities in a global area and a proximity effect area in each mesh area before resizing.

The structure mentioned above makes it possible to write a highly precise pattern in which a pattern density in a global area has been taken into consideration.

Processing contents and operation contents of what is expressed by "part" or "step" in the above description can be configured by a computer-executable program. It may be executed by a software program, or alternatively by any combination of software, hardware and/or firmware. When configured by a program, the program is recordable or storable onto a recording medium, such as a magnetic disk drive, magnetic tape drive, FD, ROM (read-only memory), DVD, CD, or MD. For example, it is recorded on a magnetic disk drive 146.

Moreover, the control computer 110 serving as a computer in FIG. 2 may be connected, via a bus not illustrated, to a RAM (Random Access Memory), a ROM, and a magnetic disk (HD) drive serving as an example of a storage device, a keyboard (K/B) and a mouse serving as an example of an input means, a monitor and a printer serving as an example of an output means, or an external interface (I/F), FD, DVD, CD, etc. serving as an example of an input/output means.

As mentioned above, the embodiments have been described with reference to concrete examples. However, the present invention is not limited to these concrete examples. For example, in the embodiments, a dose map in which an isofocal dose Dp (ISO) is assigned to each mesh area 30 is created, but it is not restricted to the map. Table data etc. in which a coordinate value and a dose Dp (ISO) are correlated may be sufficient, for example. Any data by which a dose Dp (ISO) at an irradiation position can be specified is to be employed. Similarly, though a pattern density map in which a pattern density is assigned to each mesh area 30 is created, it is not restricted to the map. Table data etc. in which a coordinate value and a pattern density are correlated may be sufficient, for example. Any data by which a pattern density at an irradiation position can be specified is to be employed. The same applies to a global mesh.

Moreover, the present invention should not limit the intended purpose of an electron beam pattern writing apparatus. For example, in addition to the intended purpose of forming a resist pattern directly on a mask or a wafer, an electron beam pattern writing apparatus is applicable to the case of making a mask for photo steppers, an X-ray mask, etc. Moreover, in the embodiments, a writing data generation apparatus is arranged to the exterior of the pattern writing apparatus 100 as the support apparatus 500, but it may be structured to be included in the pattern writing apparatus 100 as a part. Furthermore, in FIGS. 13 and 14, the design pattern is depicted as a rectangle (all the angles are 90 degrees) as an example, but it is not restricted thereto. A common two-dimensional pattern, such as a triangle, a circle, an ellipse, a ring, and the one including a slant line with an arbitrary angle, may be employed.

Apparatus configurations, control methods, etc. not directly required in explaining the present invention are not specifically described herein. However, a necessary apparatus configuration and a necessary control method can be appropriately selected and used. For example, while configuration of a control unit for controlling the pattern writing apparatus 100 is not described in detail, it should be understood that needed control unit configuration can be suitably selected and used. Moreover, the support apparatus 500 can be computer equipment, such as a personal computer (P/C) and a workstation, or an arithmetic circuit board.

Furthermore, any other writing method of charged particle beams, writing apparatus of charged particle beams, writing data generating method, and writing data generation apparatus which include elements of the present invention and which are design-modifiable by those skilled in the art and a program causing a computer to execute operations relating to the above are incorporated within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A charged particle beam writing method comprising:
   inputting design pattern data;
   virtually dividing a writing area to be written with the design pattern data into a plurality of small areas in a mesh-like manner, and calculating a pattern density in each of the plurality of small areas based on the design pattern data;
   calculating a resizing amount for each pattern density in a case of irradiating a charged particle beam at an isofocal dose;
   resizing a dimension of the design pattern data in each of the plurality of small areas, based on the resizing amount in each of the plurality of small areas; and
   writing a resized design pattern on a target workpiece with the isofocal dose corresponding to the pattern density which was calculated before the resizing in each of the plurality of small areas.

2. The charged particle beam writing method according to claim 1, wherein the resizing amount is calculated based on a difference between the isofocal dose and a dose in which proximity effect has been corrected for each pattern density.

3. The charged particle beam writing method according to claim 2, wherein the resizing amount is a value obtained by multiplying the difference by a dimension fluctuation amount at a change of unit dose of the isofocal dose.

4. The charged particle beam writing method according to claim 3, wherein as the plurality of small areas, a first plurality of small areas virtually divided to be a first mesh size and a second plurality of small areas virtually divided to be a second mesh size smaller than the first mesh size are used, and
as the pattern density, a first pattern density in each of the first plurality of small areas and a second pattern density in each of the second plurality of small areas are obtained.

5. The charged particle beam writing method according to claim 4, wherein the isofocal dose is obtained as a value corresponding to both of the first pattern density and the second pattern density.

6. The charged particle beam writing method according to claim 5, wherein the dose in which proximity effect has been corrected is obtained as a value corresponding to both of the first pattern density and the second pattern density.

7. The charged particle beam writing method according to claim 6, wherein the resizing amount is obtained as a value corresponding to both of the first pattern density and the second pattern density.

8. A support apparatus of a charged particle beam pattern writing apparatus comprising:
a pattern density calculation part configured to input design pattern data, virtually divide a writing area to be written with the design pattern data into a plurality of small areas in a mesh-like manner, and calculate a pattern density in each of the plurality of small areas based on the design pattern data;
a storage device configured to store a first correlation data on a correlation between the pattern density and an isofocal dose of a charged particle beam, and a second correlation data on a correlation between the pattern density and a resizing amount;
an isofocal dose calculation part configured to read the first correlation data from the storage device, and calculate the isofocal dose of the charged particle beam in each of the plurality of small areas using the first correlation data;
a resizing processing part configured to read the second correlation data from the storage device, and resize a dimension of the design pattern data in each of the plurality of small areas using the second correlation data; and
an output part configured to output the isofocal dose of the charged particle beam and resized design pattern data in each of the plurality of small areas to a pattern writing apparatus which writes a pattern on a target workpiece using the charged particle beam.

9. A writing data generating method comprising:
inputting design pattern data;
virtually dividing a writing area to be written with the design pattern data into a plurality of small areas in a mesh-like manner, and calculating a pattern density in each of the plurality of small areas based on the design pattern data;
calculating an isofocal dose in each of the plurality of small areas using correlation data on a correlation between the pattern density and the isofocal dose;
resizing a dimension of the design pattern data in each of the plurality of small areas using correlation data on a correlation between the pattern density and a resizing amount; and
outputting the isofocal dose in each of the plurality of small areas and resized design pattern data in each of the plurality of small areas.

10. A computer-readable recording medium with a program recorded for causing a computer to execute processes of:
storing design pattern data in a storage device;
reading the design pattern data from the storage device, virtually dividing a writing area to be written with the design pattern data into a plurality of small areas in a mesh-like manner, and calculating a pattern density in each of the plurality of small areas based on the design pattern data;
reading first correlation data on a correlation between the pattern density and an isofocal dose from a storage device which stores the first correlation data, and calculating the isofocal dose of each of the plurality of small areas using the first correlation data;
reading second correlation data on a correlation between the pattern density and a resizing amount from a storage device which stores the second correlation data, and resizing a dimension of the design pattern data in each of the plurality of small areas using the second correlation data; and
outputting the isofocal dose of each of the plurality of small areas and resized design pattern data in each of the plurality of small areas.

* * * * *